(12) United States Patent
Kanno et al.

(10) Patent No.: US 7,403,080 B2
(45) Date of Patent: Jul. 22, 2008

(54) TRANSMISSION LINE APPARATUS HAVING CONDUCTIVE STRIPS COUPLED BY AT LEAST ONE ADDITIONAL CAPACITANCE ELEMENT

(75) Inventors: Hiroshi Kanno, Osaka (JP); Kazuyuki Sakiyama, Osaka (JP); Ushio Sangawa, Nara (JP); Tomoyasu Fujishima, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 1 day.

(21) Appl. No.: 11/504,722

(22) Filed: Aug. 16, 2006

(65) Prior Publication Data

US 2007/0056764 A1 Mar. 15, 2007

Related U.S. Application Data

(63) Continuation of application No. PCT/JP2006/311759, filed on Jun. 12, 2006.

(30) Foreign Application Priority Data

Jun. 14, 2005 (JP) ............................. 2005-173368

(51) Int. Cl.
 *H01P 3/08* (2006.01)
(52) U.S. Cl. ............................. 333/4; 333/5; 333/246
(58) Field of Classification Search .................. 333/4,
 333/5, 236, 246, 238
See application file for complete search history.

(56) References Cited

U.S. PATENT DOCUMENTS

2004/0000959 A1 1/2004 Howard et al.

2005/0056455 A1 3/2005 Masu et al.

FOREIGN PATENT DOCUMENTS

| JP | 3-41803 | 2/1991 |
|---|---|---|
| JP | 2001-102488 | 4/2001 |
| JP | 2001-257509 A | 9/2001 |

(Continued)

OTHER PUBLICATIONS

International Search Report issued in corresponding International Patent Application No. PCT/JP2006/311759, dated Aug. 29, 2006.

*Primary Examiner*—Benny Lee
(74) *Attorney, Agent, or Firm*—McDermott Will & Emery LLP

(57) ABSTRACT

A transmission line apparatus includes: a substrate 101 with a ground conductor plane; and first and second signal strips 102a, 102b supported on the substrate 101 in parallel with each other. The apparatus further includes at least one additional capacitance element 301 that connects the first and second signal strips 102a, 102b together. The element 301 includes: a first additional conductor 303 spaced from the first signal strip 102a; a second additional conductor 305 spaced from the second signal strip 102b; and a third additional conductor 307 connected to the first and second additional conductors 303, 305 at respective points. When measured in a signal transmission direction, the smallest width W3a of the third additional conductor 307 is shorter than the length L1 or L2 of the first or second additional conductor 303 or 305. And the additional capacitance element 301 has a resonant frequency that is higher than the frequency of a signal being transmitted.

12 Claims, 16 Drawing Sheets

FOREIGN PATENT DOCUMENTS

| | | |
|---|---|---|
| JP | 2002-299917 | 10/2002 |
| JP | 2004-7657 | 1/2004 |
| JP | 2004-15534 A | 1/2004 |
| JP | 2004-48750 A | 2/2004 |
| JP | 2005-101587 | 4/2005 |

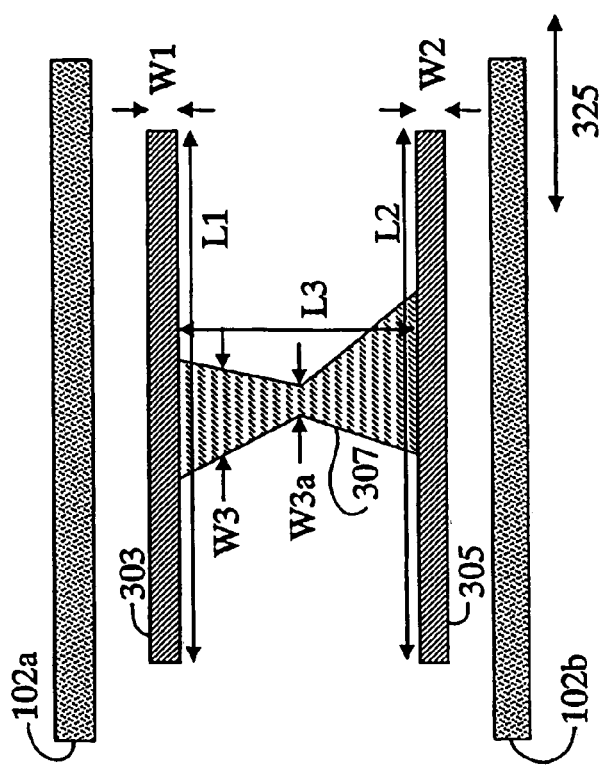
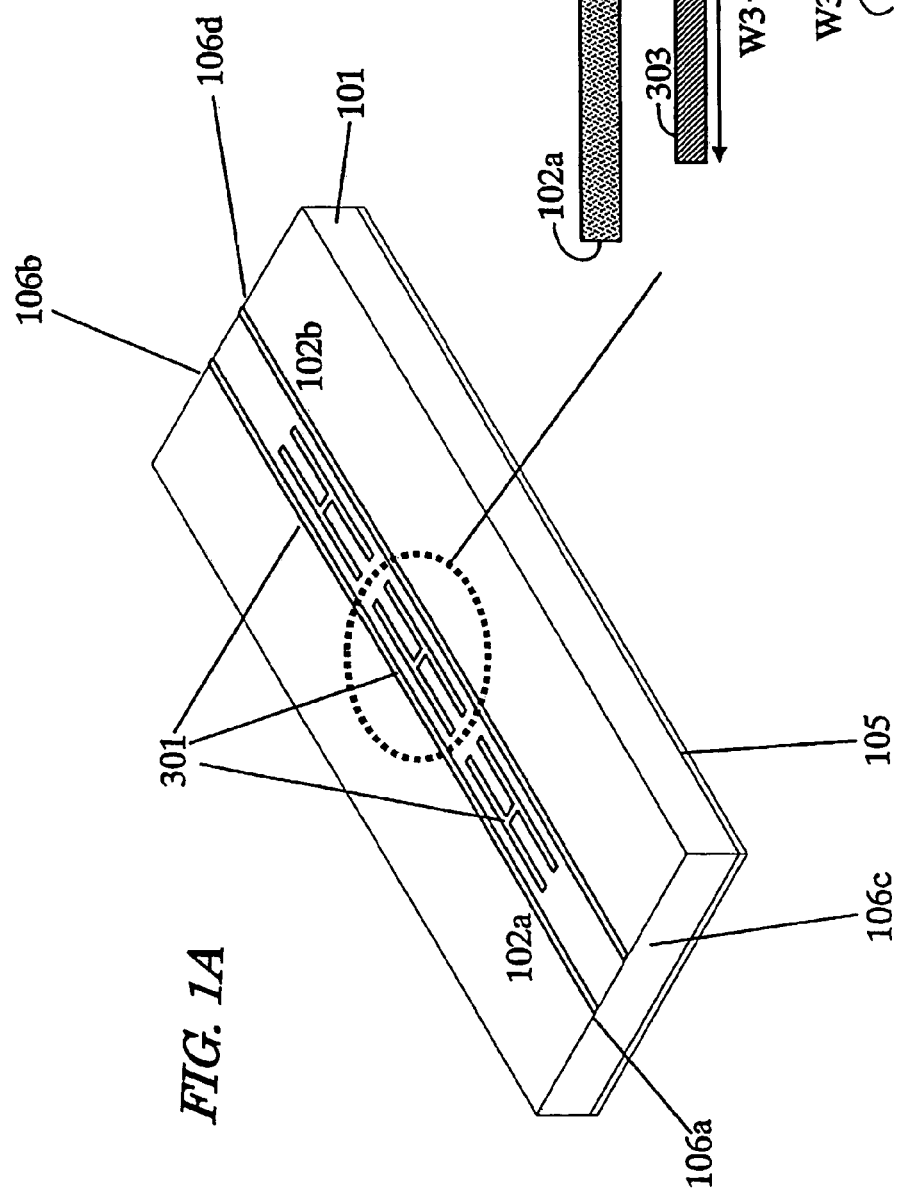
FIG. 1B
FIG. 1A

*FIG. 3*
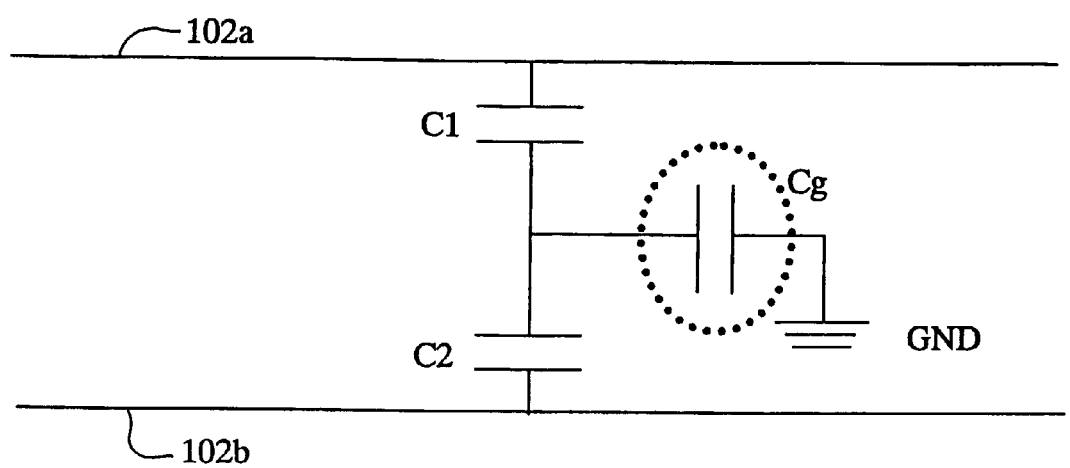
*FIG. 4A*  *FIG. 4B*  *FIG. 4C*
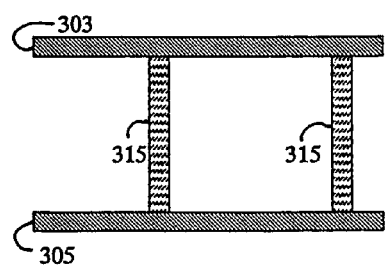 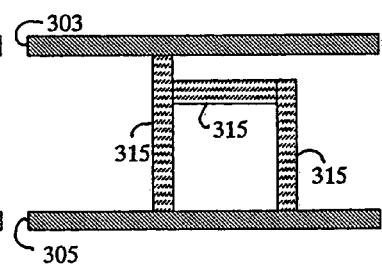 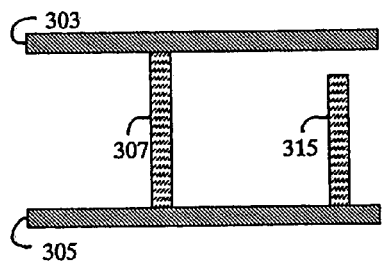

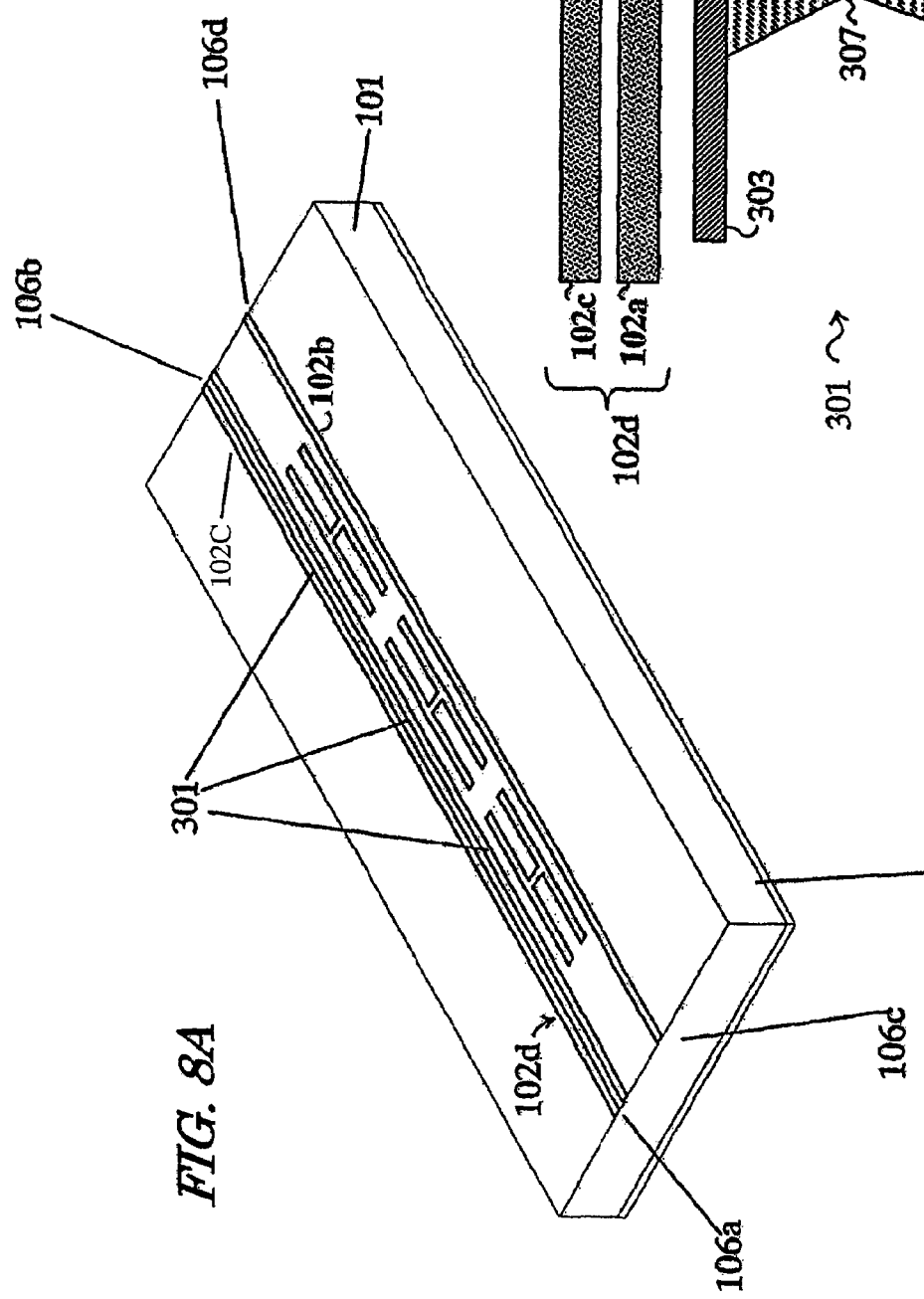

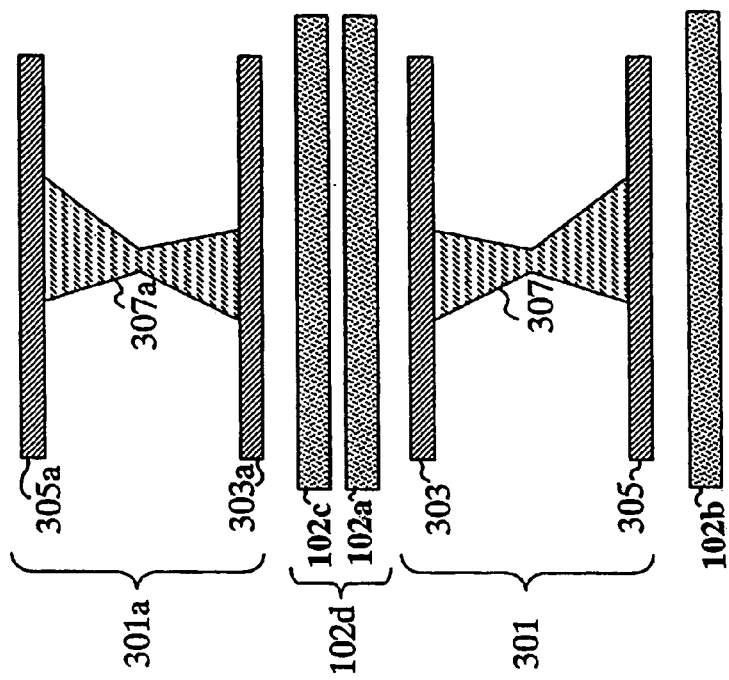
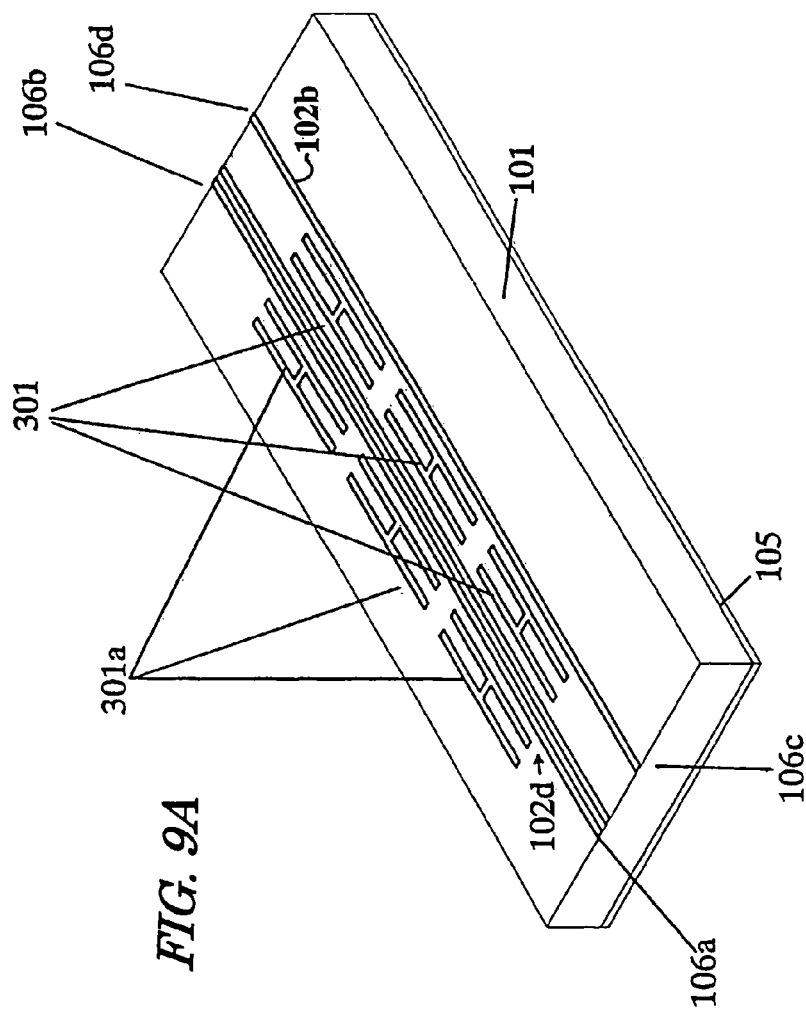
FIG. 9A
FIG. 9B

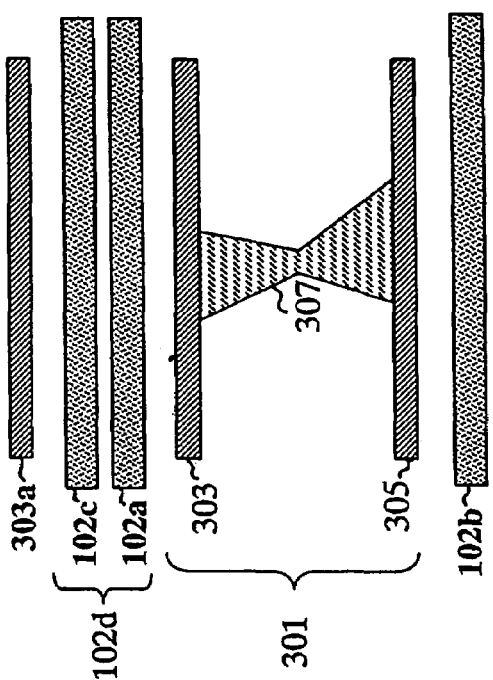
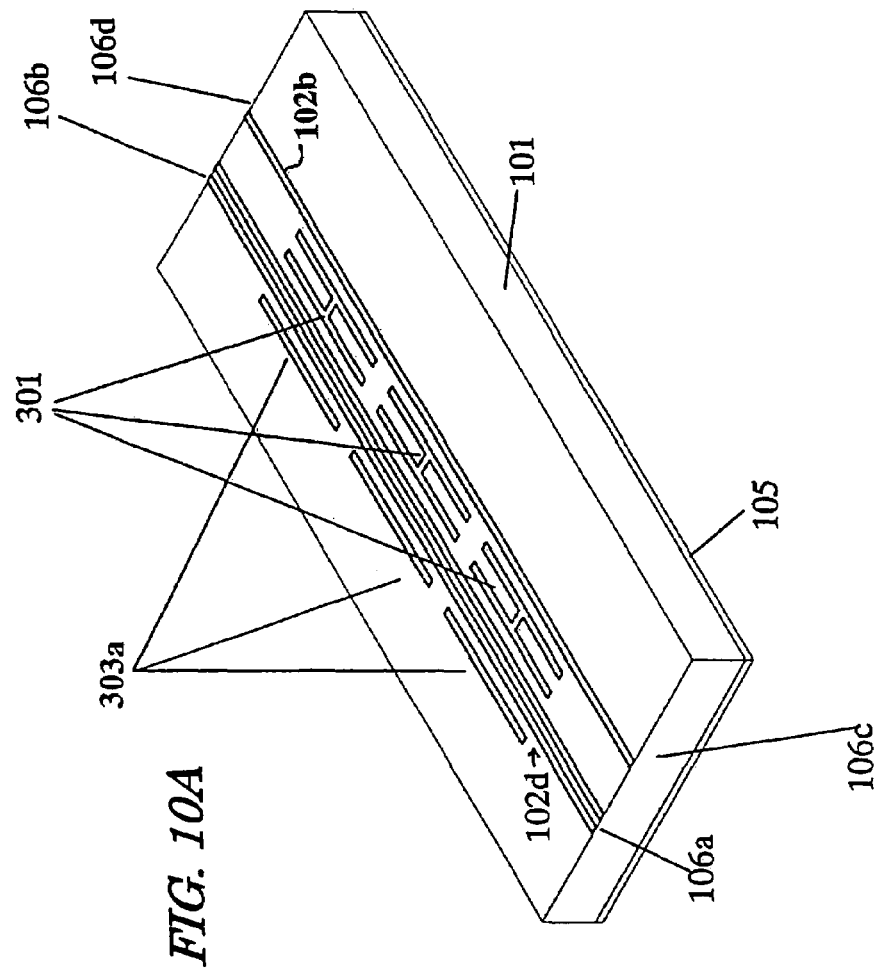

FIG. 11                                       Prior Art
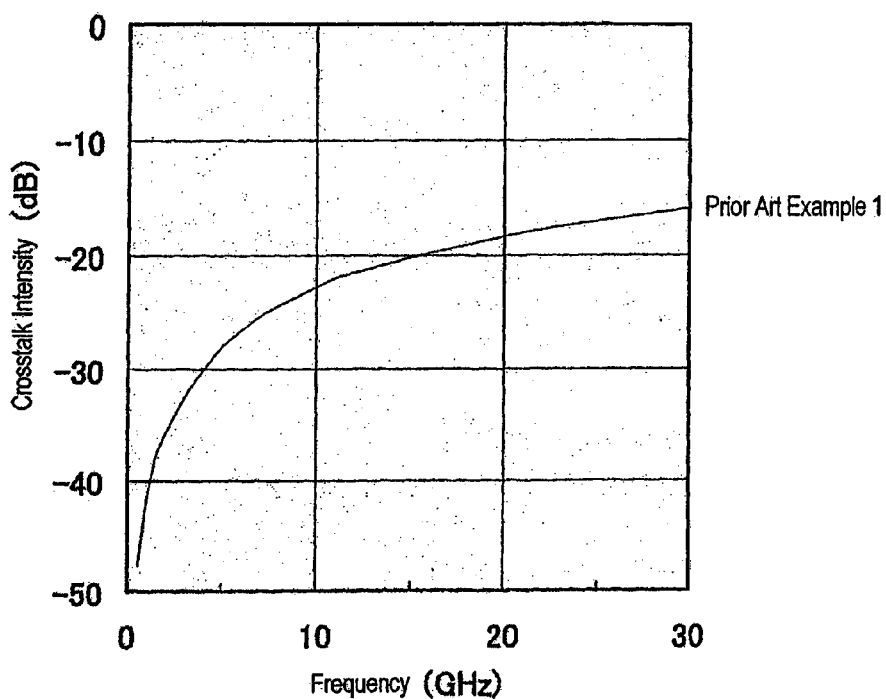
FIG. 12                                       Prior Art
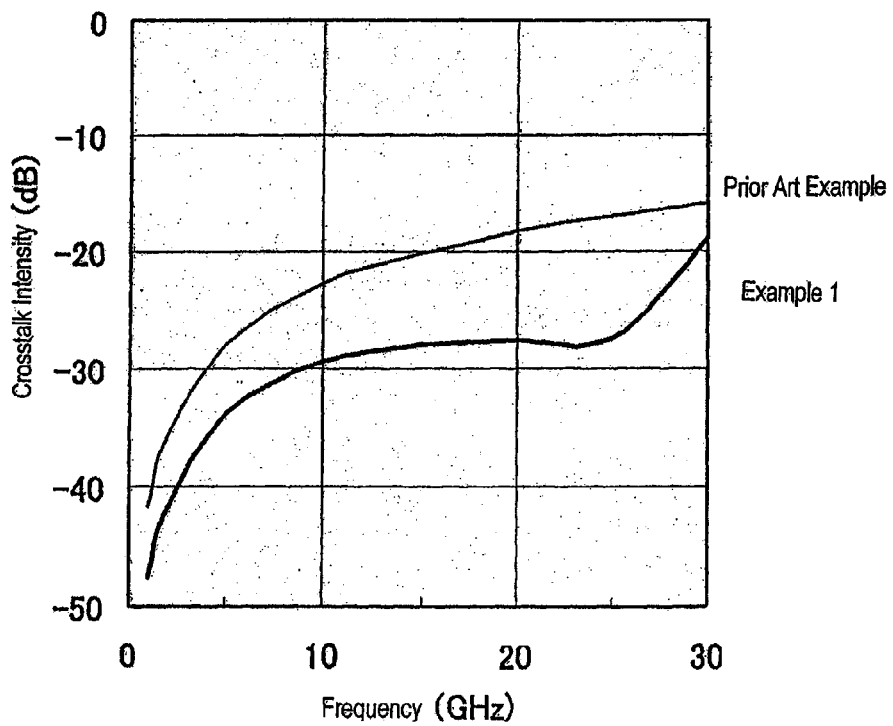

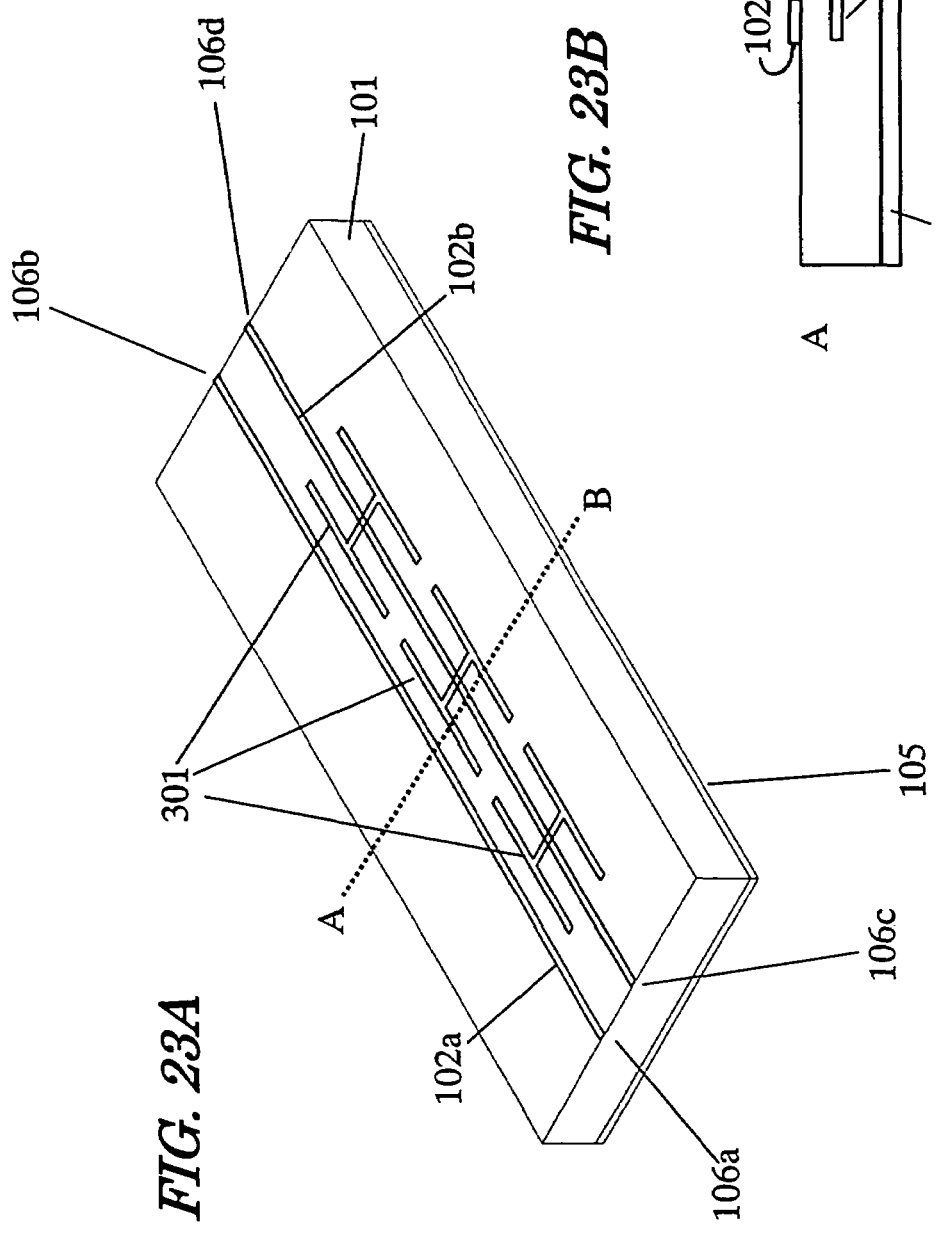
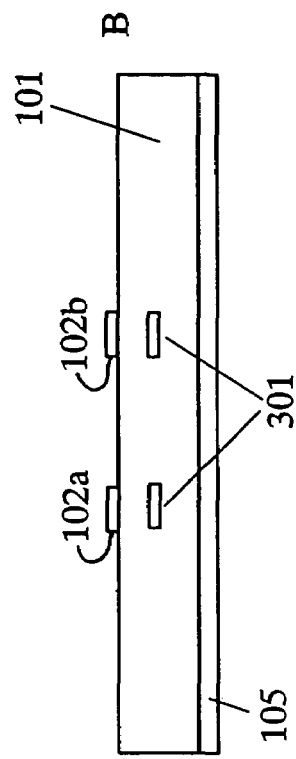
FIG. 23A
FIG. 23B

TRANSMISSION LINE APPARATUS HAVING CONDUCTIVE STRIPS COUPLED BY AT LEAST ONE ADDITIONAL CAPACITANCE ELEMENT

This is a continuation of International Application No. PCT/JP2006/311759, with an international filing date of Jun. 12, 2006, which claims priority of Japanese Patent Application No. 2005-173368, filed on Jun. 14, 2005, the contents of which are hereby incorporated by reference.

BACKGROUND OF THE INVENTION

1. Field of the Invention

The present invention relates to a transmission line apparatus for transmitting an analog RF signal or a digital signal that has a frequency falling within a microwave band or a milliwave band.

2. Description of the Related Art

FIG. 15A illustrates the cross-sectional structure of a microstrip line, which is used as conventional transmission line. In FIG. 15A, a signal strip 102 is formed on a substrate 101 made of a dielectric material or a semiconductor, while a ground conductor layer 105 is formed on the back surface of the substrate 101. When radio frequency power is supplied to this microstrip line, an electric field is generated between the signal strip 102 and the ground conductor layer 105. On the other hand, a magnetic field is generated perpendicularly to the electric lines of force so as to surround the signal strip 102. And the radio frequency power propagates in the longitudinal direction in which this electromagnetic field crosses the width direction of the signal strip 102 at right angles. In the microstrip line, the signal strip 102 and the ground conductor layer 105 do not have to be formed on the surface and back surface of the substrate 101. Alternatively, if the substrate 101 is implemented as a multilayer circuit board, then the signal strip 102 and ground conductor layer 105 may be formed on an inner conductor plane of the circuit board.

The transmission line described above is used to transmit a single-ended signal. However, if two microstrip wiring circuit structures are arranged parallel to each other as shown in the cross-sectional view of FIG. 15B and if signals of mutually inverse phases are supplied to those two lines, the pair of microstrip lines may be used as a differential transmission line. In that case, since signals of inverse phases are supplied to, and transmitted through, a pair of signal strips 102a and 102b, a virtual ground plane is produced between the signal strips 102a and 102b. Therefore, a differential transmission line could be formed without the ground conductor layer 105, theoretically speaking. Actually, however, a differential transmission line often has a circuit configuration including the ground conductor layer.

As shown in FIGS. 16A and 16B, two or more signal strips 102a and 102b are often densely arranged side by side and parallel to each other in an analog circuit or a high-speed digital circuit. In FIGS. 16A and 16B, W is the distance between two or more signal strips 102a and 102b, G is the gap between the signal strips and D shows the distance between the center of the signal strips. As a result, crosstalk will often occur between the adjacent transmission lines, thus causing the problem of a decreased degree of isolation.

Japanese Patent Application Laid-Open Publication No. 2001-257509 attributes the crosstalk phenomenon to a difference in intensity between a negative induced voltage caused by the mutual inductance of a pair of transmission lines and a positive induced voltage caused by the mutual capacitance thereof. An equivalent circuit of a pair of transmission lines per unit length is defined by the series inductance L, ground capacitance C and mutual inductance M of the transmission lines and the mutual capacitance Cm between the transmission lines as shown in FIG. 17.

If an RF voltage Vo is supplied to the input terminal 106a shown in FIG. 17 so as to travel through the signal strip 102a, then induced voltages Vi and Vc are caused in its adjacent signal strip 102b due to mutual inductance and mutual capacitance, respectively. Vi and Vo have the opposite signs but Vc and Vo have the same sign. Terminals 106b and 106c are shown in FIG. 17. As a result, a far-end crosstalk voltage with an intensity Vc-Vi is produced at a far-end crosstalk terminal 106d. On normal conditions on which signal strips are arranged densely, Vc has a lower intensity than Vi, and therefore, the far-end crosstalk voltage eventually has the sign opposite to that of the input voltage Vo. Such a crosstalk problem is non-negligible if the coupled line length Lcp of multiple adjacent transmission lines is equal to or greater than one-fourth of the effective wavelength at the transmission signal frequency.

Japanese Patent Application Laid-Open Publication Nos. 2001-257509 and 2004-015534 disclose methods for suppressing this crosstalk phenomenon. Both of those methods follow the principle of offsetting the difference in intensity between Vi and Vc by decreasing an additional induced voltage Vadd and increasing Vc. That is to say, the far-end crosstalk is minimized by newly providing a so-called "additional capacitance element" that increases the mutual capacitance between the transmission lines. As shown in the equivalent circuit diagram of FIG. 18, a capacitance Ca between the transmission lines is newly added to the equivalent circuit of the pair of transmission lines shown in FIG. 17.

As to the method of implementing Ca, Japanese Patent Application Laid-Open Publication No. 2001-257509 discloses two specific configurations as examples. According to a first one of the two configurations, Ca to be inserted between first and second signal strips 102a and 102b is implemented by capacitors 317 as shown in FIG. 19. On the other hand, according to the second configuration, the gap between the signal strips is narrowed by broadening the respective widths of the signal strips of the transmission lines.

Japanese Patent Application Laid-Open Publication No. 2004-015534 discloses configurations that introduce additional members called "crosstalk suppressing components". Specifically, as shown in the perspective view of FIG. 20, crosstalk suppressing components 319, each partially making a plane contact with the first and second signal strips 102a and 102b and connecting the first and second signal strips 102a and 102b together with a conductor, are arranged. A sufficient capacitance is produced in the intersecting area between each of the crosstalk suppressing components 319 and the first or second signal strip 102a, 102b. And those capacitances are connected in series together, thus achieving the same effects as those achieved by Japanese Patent Application Laid-Open Publication No. 2001-257509. Examples of the crosstalk suppressing components 319 disclosed in Japanese Patent Application Laid-Open Publication No. 2004-015534 include a rectangular one as shown in the top view of FIG. 21A and a one with a shape that is designed to include a phase advancing area 313c between a capacitance area 313a intersecting with the first signal strip and a capacitance area 313b intersecting with the second signal strip as shown in the top view of FIG. 21B. In the following description, the crosstalk suppressing components shown in FIGS. 21A and 21B will be respectively referred to herein as Configuration Examples Nos. 1 and 2 of Japanese Patent Application Laid-Open Publication No. 2004-015534. Their equivalent circuits are also disclosed in Japanese Patent Application Laid-Open Publication No. 2004-015534. As shown in FIG. 22, the additional capacitance Ca of the equivalent circuit disclosed in Japanese Patent Application Laid-Open Publication No. 2001-257509 is implemented by a circuit in which capacitances C1 and C2 are connected in series together. In Configuration Example No. 2 of Japanese Patent Application Laid-Open Publication No. 2004-015534, inductance Lp is intentionally added between the capacitances C1 and C2.

Those conventional pairs of transmission lines that are specially designed to suppress the crosstalk, however, have the following three problems, for example, and are actually unable to suppress the crosstalk effectively.

Firstly, Configuration Example No. 1 of Japanese Patent Application Laid-Open Publication No. 2001-257509 needs additional external circuit components in capacitors, thus requiring increased component and assembling costs. The crosstalk suppressing components disclosed in Japanese Patent Application Laid-Open Publication No. 2004-015534 also have a similar problem. Also, even though the thickness of the circuit should be reduced as much as possible, the thickness of the chip component needs to be added to that of the circuit board. As a result, the volume of the circuit increases. Furthermore, if the external chip components or the external components called the "crosstalk suppressing components" are used in a pair of transmission lines to transmit a high-speed signal, then the transmission performance itself varies due to some variations in either assembling or in the characteristics of the chip components.

Thus, first of all, a transmission line apparatus that can suppress the crosstalk using some component that has been integrated with the circuit board, not the external components, needs to be provided. To realize high-speed transmission and connection with functional components, the transmission lines are preferably formed on the surface of a substrate. That is why a method of suppressing crosstalk with an additional capacitance element arranged on either the surface of the substrate along with the transmission lines or on an inner surface of the substrate needs to be provided.

Secondly, if an additional capacitance element were arranged inside a circuit as taught in Japanese Patent Application Laid-Open Publication No. 2001-257509 or 2004-015534, then the crosstalk characteristic should be improved in an ideal equivalent circuit. In an actual circuit, however, it is difficult to improve that characteristic. Thus, the crosstalk suppressing effects need to be achieved in an actual circuit by correcting the imperfections of the principles of Japanese Patent Application Laid-Open Publication Nos. 2001-257509 and 2004-015534.

Thirdly, according to a method of increasing the mutual capacitance between the signal lines by locally increasing the line widths of the signal lines as disclosed in Japanese Patent Application Laid-Open Publication No. 2001-257509, the characteristic impedances of the lines change, thus deteriorating the transmission characteristic. That is why a structure that never deteriorates the transmission characteristic needs to be provided.

In order to overcome the problems described above, an object of the present invention is to provide a transmission line apparatus that can improve the crosstalk characteristic of an actual circuit without using any additional component and with the influence of parasitic components of the circuit elements taken into consideration and that never deteriorates the transmission characteristic.

SUMMARY OF THE INVENTION

A transmission line apparatus according to the present invention includes: a substrate with a ground conductor plane; and a first signal strip and a second signal strip, which are supported on the substrate and arranged in parallel with each other. The apparatus further includes at least one additional capacitance element that connects the first and second signal strips together. The additional capacitance element includes: a first additional conductor that is arranged with a space left with respect to the first signal strip; a second additional conductor that is arranged with a space left with respect to the second signal strip; and a third additional conductor that is connected to the first additional conductor at a point and to the second additional conductor at another point, respectively. When measured in a signal transmission direction, the smallest width W3$a$ of the third additional conductor is shorter than the length L1 of the first additional conductor or the length L2 of the second additional conductor. And the additional capacitance element has a resonant frequency that is higher than the frequency of a signal being transmitted.

In one preferred embodiment, the first signal strip, the second signal strip and the additional capacitance element are all positioned on the same circuit plane.

In another preferred embodiment, the first and second signal strips are arranged on the surface of the substrate, and the additional capacitance element is located between the surface of the substrate and the ground conductor plane.

In this particular preferred embodiment, the additional capacitance element is located closer to the ground conductor plane than to the surface of the substrate.

In still another preferred embodiment, the lengths L1 and L2 of the first and second additional conductors are equal to each other, the respective midpoints of the first and second additional conductors are connected together by the third additional conductor, and the third additional conductor crosses the first additional conductor at right angles.

In yet another preferred embodiment, the at least one additional capacitance element includes a plurality of additional capacitance elements that are arranged in the transmission direction.

In this particular preferred embodiment, the interval between the additional capacitance elements is one quarter or less of an effective wavelength corresponding to the frequency of the signal being transmitted.

In yet another preferred embodiment, the first and second signal strips and the first and second additional conductors are arranged on the surface of the substrate. The space between the first signal strip and the first additional conductor and the space between the second signal strip and the second additional conductor are filled at least partially with a dielectric material that has a higher dielectric constant than the air.

In yet another preferred embodiment, the apparatus further includes a third signal strip, which is arranged with a space left with respect to the first signal strip, and the first and third signal strips form a differential transmission line.

In that case, a fourth additional conductor, of which the structure is symmetric to that of the first additional conductor with respect to a central symmetric plane of the differential transmission line, may be arranged with a space left with respect to the third signal strip.

In an alternative preferred embodiment, the apparatus further includes a third signal strip, which is arranged with a space left with respect to the second signal strip, and the second and third signal strips form a differential transmission line.

In that case, a fourth additional conductor, of which the structure is symmetric to that of the second additional conductor with respect to a central symmetric plane of the differential transmission line, may be arranged with a space left with respect to the third signal strip.

A transmission line apparatus according to the present invention adopts an additional capacitance element with a novel structure that can reduce ground capacitance instead of the additional capacitance element that cannot suppress the crosstalk sufficiently in the conventional transmission line apparatus. As a result, the crosstalk can be actually suppressed effectively.

In addition, according to the present invention, the additional capacitance element can be arranged as an integrated element, not as a chip component. Consequently, a transmission line apparatus that is advantageous in terms of cost, circuit capacity and performance is realized with no need to consider any variation between chip components during the design process.

Furthermore, according to the present invention, the deterioration in the transmission characteristic of signals can also be reduced compared to the method of reducing the crosstalk by bringing the lines closer to each other with the line widths increased locally as adopted in the conventional transmission line apparatus.

BRIEF DESCRIPTION OF THE DRAWINGS

FIG. 1A is a schematic perspective view illustrating a preferred embodiment of a transmission line apparatus according to the present invention and FIG. 1B is a partially enlarged top view thereof.

FIG. 3 shows an equivalent circuit diagram of a transmission line apparatus according to the present invention.

FIGS. 4A and 4B are top views illustrating circuit structures that cannot be considered additional capacitance elements according to a preferred embodiment of the present invention and FIG. 4C is a top view illustrating a circuit structure that can be called an additional capacitance element according to a preferred embodiment of the present invention.

FIGS. 8A and 8B are respectively a schematic perspective view and a partially enlarged top view illustrating another preferred embodiment of the present invention.

FIGS. 9A and 9B are respectively a schematic perspective view and a partially enlarged top view illustrating another preferred embodiment of the present invention.

FIGS. 10A and 10B are respectively a schematic perspective view and a partially enlarged top view illustrating another preferred embodiment of the present invention.

FIG. 11 shows the frequency dependence of crosstalk intensity in Prior Art Example 1.

FIG. 12 shows the frequency dependences of crosstalk intensities in Prior Art Example 1 and Example 1.

FIG. 23A is a schematic perspective view illustrating a preferred embodiment of a transmission line apparatus according to the present invention including an additional capacitance element inside a substrate, and FIG. 23B is a cross-sectional view thereof as viewed on the plane XXIIIb-XXIIIb.

DETAILED DESCRIPTION OF PREFERRED EMBODIMENTS

Figure 2A:
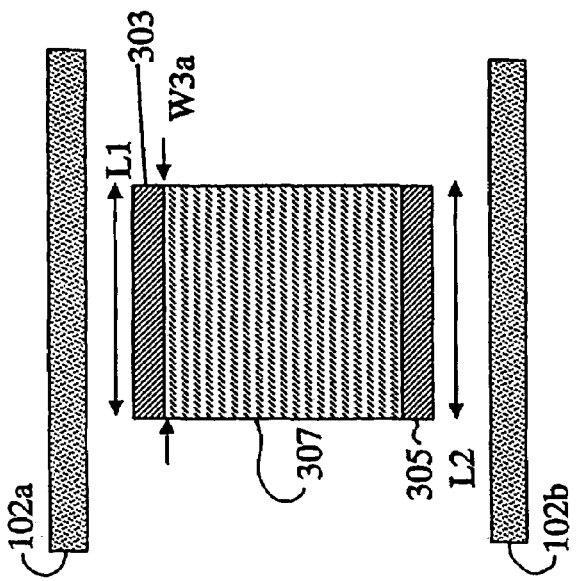
FIGS. 2A, 2B and 2C are top views illustrating circuit structures that cannot be considered additional capacitance elements according to a preferred embodiment of the present invention.

A transmission line apparatus according to the present invention suppresses the crosstalk by inserting an additional capacitance element between a pair of transmission lines. The transmission line apparatus of the present invention and the conventional transmission line apparatus both use an additional capacitance element. According to the present invention, however, the additional capacitance element is designed so as to be integrated easily, and therefore, can be formed integrally with transmission lines during the process step of forming the transmission lines. Consequently, compared to the conventional transmission line apparatus that uses capacitors as external components, the manufacturing cost and the overall circuit area can be reduced. Moreover, the variation in characteristics that is often caused when the transmission lines are connected to an external component is also avoided.

The present inventors paid special attention to the ground capacitance that is produced between the additional capacitance element and the ground conductor but that has been ignored in the prior art. The inventers have discovered that one of the important factors that has prevented the conventional transmission line from suppressing the crosstalk effectively when the additional capacitance element is arranged on a substrate is this ground capacitance. According to the present invention, since such ground capacitance is reduced, the crosstalk characteristic of an actual apparatus can be improved. What is more, since the crosstalk can be suppressed according to the present invention without changing the shape of the signal strips, there are no factors that would deteriorate the signal transmission characteristic of the signal lines.

Hereinafter, a first preferred embodiment of a transmission line apparatus according to the present invention will be described with reference to FIGS. 1A and 1B, which are respectively a schematic perspective view of a transmission line apparatus according to this preferred embodiment and an enlarged top view of the portion of the transmission line that is indicated by the dotted circle in FIG. 1A. Hereinafter, the accompanying drawings with the same or substantially similar parts, elements or features that appear in more than one view of the drawings are labeled with the same reference numerals or labels.

In this preferred embodiment, an additional capacitance element 301 is arranged between first and second transmission lines, which have been formed on a circuit board 101, so as to be coupled to the first and second transmission lines with a capacitance produced between them. In the best mode of the present invention, the additional capacitance element 301 has an H-shape layout. See FIG. 1A.

The first transmission line consists of a first signal strip 102a and a ground conductor 105, while the second transmission line consists of a second signal strip 102b and the ground conductor 105. In this preferred embodiment, a single conductor layer is shared as the ground conductors of these two transmission lines. In the example illustrated in FIG. 1A, the ground conductor 105 is arranged on the back surface of the circuit board 101. Alternatively, the ground conductor 105 may be arranged on an inner surface of the circuit board 101.

Hereinafter, the configuration of the transmission line apparatus of this preferred embodiment will be described in further detail.

As shown in FIG. 1B, the additional capacitance element 301 includes a first additional conductor 303 of length L1 and width W1, which is arranged closest to the first transmission line 102a, and a second additional conductor 305 of length L2 and width W2, which is arranged closest to the second transmission line 102b. The first and second additional conductors 303 and 305 are connected together by a third additional conductor 307. The third additional conductor 307 extends perpendicularly to the signal transmission direction 325. If the line width W3 of the third additional conductor 307 is defined as the width of the conductor as measured in the signal transmission direction 325, the minimum value W3a of W3 is smaller than the length L1 of the first additional conductor 303 as measured in the signal transmission direction 325 and the length L2 of the second additional conductor 305 as measured in the signal transmission direction 325. That is to say, W3a <L1, L2 is satisfied.

Figure 2B:
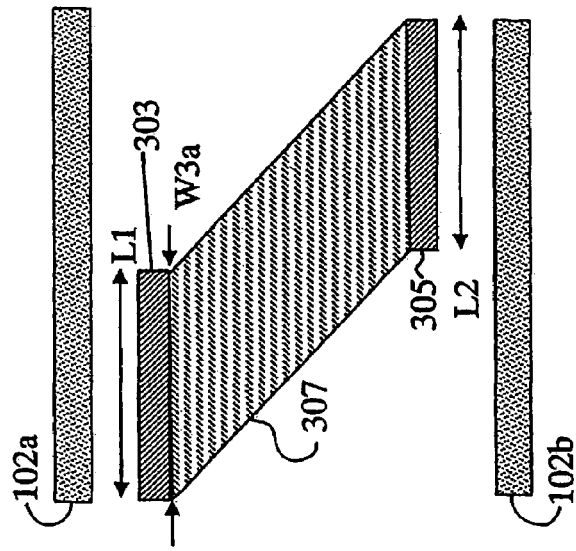
Figure 2C:
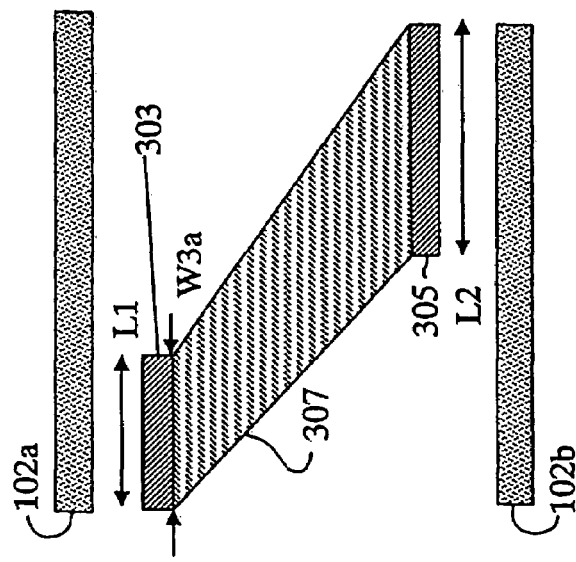

In other words, if the additional capacitance element 301 fails to satisfy this condition, the element 301 may have non-preferred shapes such as those illustrated in FIGS. 2A, 2B and 2C.

Specifically, if the first and second additional conductors 303 and 305 are arranged parallel to each other and if L1≠L2 (L1<L2), then the third additional conductor 307 of the non-preferred additional capacitance element has a trapezoidal shape, of which the upper and lower sides are defined by the first and second additional conductors, respectively, and in which W3a=L1 as shown in FIG. 2A.

On the other hand, if L1=L2, then W3a=L1=L2 as shown in FIG. 2B and the third additional conductor 307 of the non-preferred additional capacitance element has a parallelogram shape, of which the upper and lower sides are defined by the first and second additional conductors 303 and 305, respectively.

Figure 18:
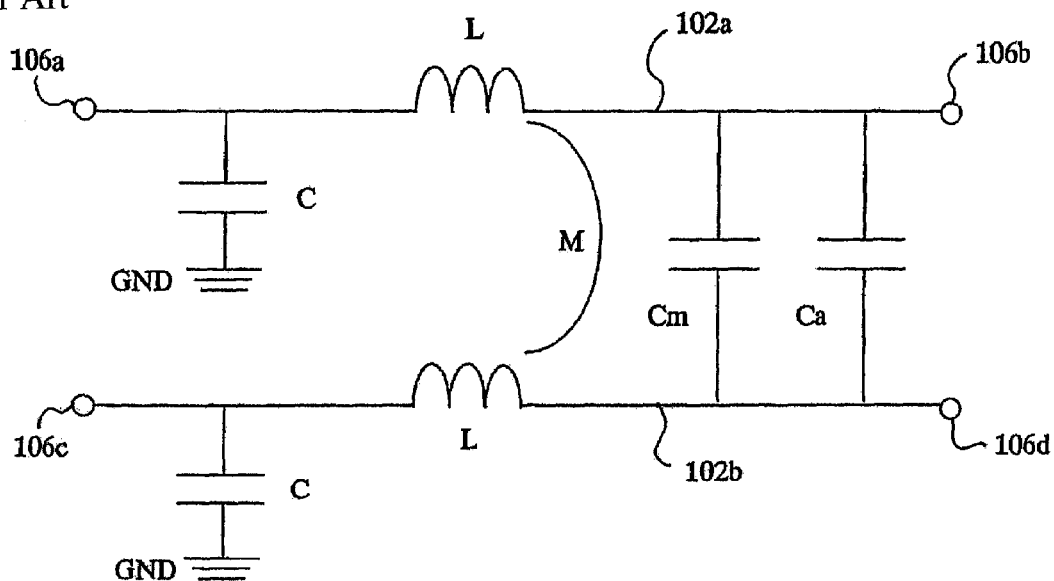
FIG. 18 is an equivalent circuit diagram of a transmission line pair that is disclosed in Japanese Patent Application Laid-Open Publication Nos. 2001-257509 and 2004-015534.
Figure 19:
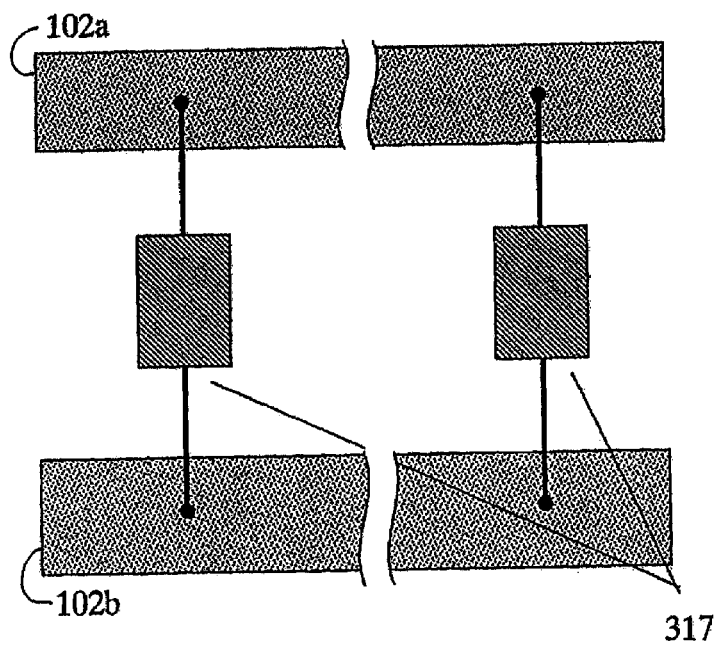
FIG. 19 is a schematic representation of a transmission line pair that is disclosed in Japanese Patent Application Laid-Open Publication No. 2001-257509 to implement Ca.
Figure 20:
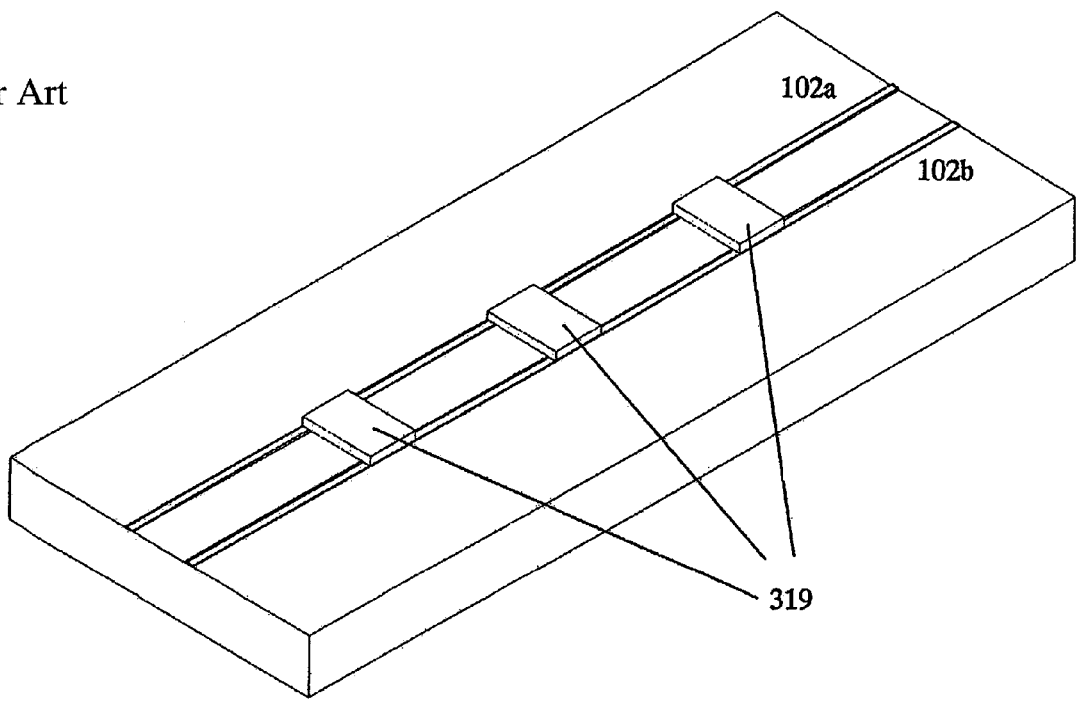
FIG. 20 is a perspective view illustrating a transmission line pair disclosed in Japanese Patent Application Laid-Open Publication No. 2004-015534.
Figure 21A:
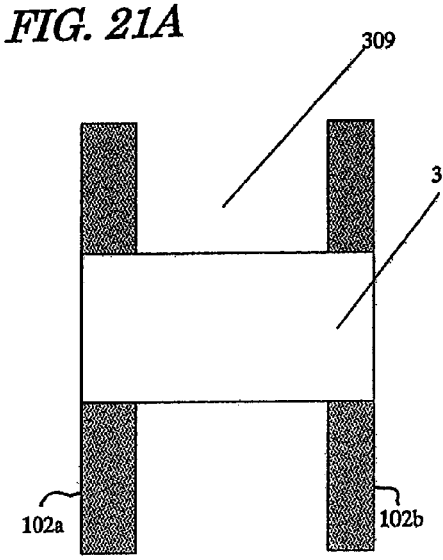
FIGS. 21A and 21B illustrate examples of crosstalk suppressing components 319 disclosed in Japanese Patent Application Laid-Open Publication No. 2004-015534.
Figure 21B:
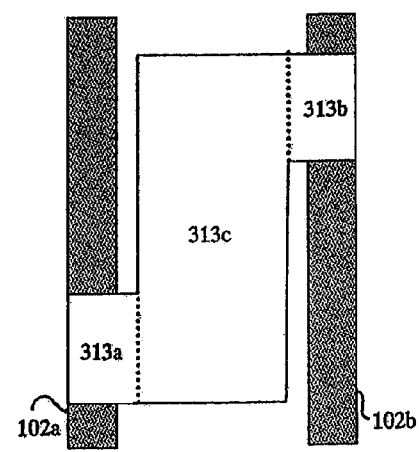

As another possibility, if L1=L2 and if the first and second additional conductors 303 and 305 are arranged parallel to each other by being shifted perpendicularly to the signal transmission direction 325, then the third additional conductor 307 of the non-preferred additional capacitance element has a rectangular shape, of which the two opposing sides are defined by the first and second additional conductors 303 and 305, respectively, as shown in FIG. 2C. However, none of the non-preferred additional capacitance elements with these shapes can achieve the effects of reducing the far-end crosstalk, which is one of the common objects of the present invention and Japanese Patent Application Laid-Open Publication Nos. 2001-257509 and 2004-015534. This is because in the equivalent circuit diagram shown in FIG. 18 and disclosed in Japanese Patent Application Laid-Open Publication No. 2001-257509 or for Configuration Example No. 1 of Japanese Patent Application Laid-Open Publication No. 2004-015534, neither the function of the third additional conductor nor the parasitic circuit parameters of the third additional conductor are shown properly.

FIG. 3 is an equivalent circuit diagram with ground labeled GND and showing the pair of transmission lines of this preferred embodiment per unit length. The additional capacitance element 301 inserted electromagnetically between the transmission lines 102a and 102b functions as a circuit that connects the transmission lines together with a capacitance just like the additional capacitance elements disclosed in Japanese Patent Application Laid-Open Publication Nos. 2001-257509 and 2004-015534. That is to say, the additional capacitance element 301 performs the function of generating a signal Vadd, of which the phase is inverse of that of the differential signal between Vi and Vc, so as to offset the difference between an inductive crosstalk voltage Vi and a capacitive crosstalk voltage Vc that are generated in normal transmission lines.

More specifically, the capacitance described above is the serial connection of two capacitances C1 and C2. C1 is the capacitance produced between the first transmission line 102a and the first additional conductor 303, while C2 is the capacitance produced between the second transmission line 102b and the second additional conductor 305. In FIG. 3, however, a ground capacitance Cg, which is disclosed in neither Japanese Patent Application Laid-Open Publication No. 2001-257509 nor No. 2004-015534, is newly added, as indicated by the dotted circle, between C1 and C2 that connect the two transmission lines together. The ground capacitance Cg is a parasitic component, which is produced particularly around the third additional conductor of the additional capacitance element. This ground capacitance Cg plays the role of rotating the phase for a signal that travels between the first and second additional conductors by way of the third additional conductor.

Figure 22:
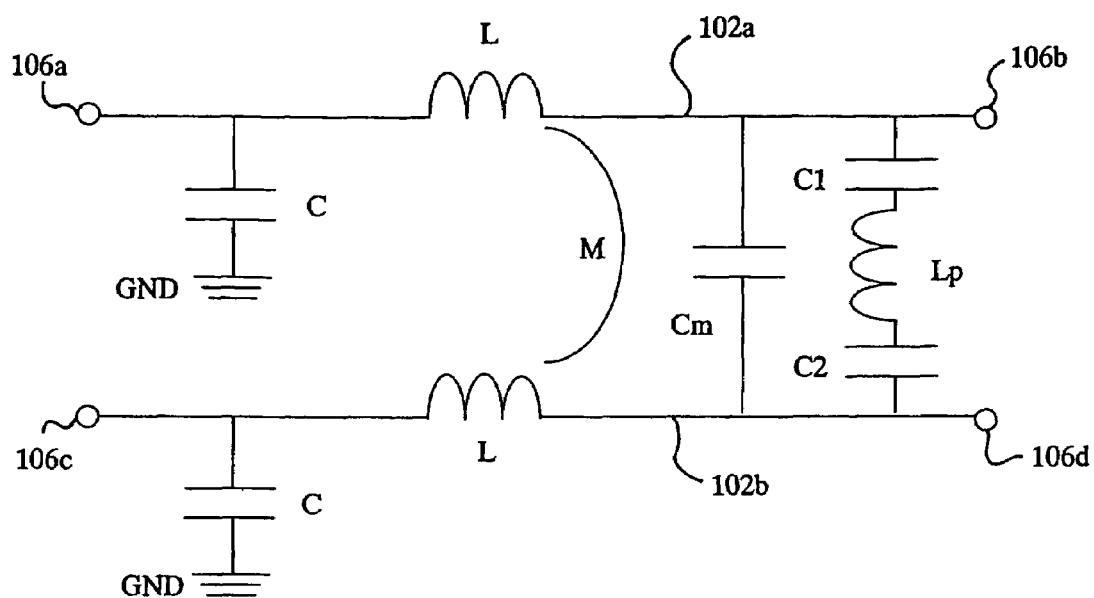
FIG. 22 shows an example in which the additional capacitance element Ca of the equivalent circuit disclosed in Japanese Patent Application Laid-Open Publication No. 2001-257509 is implemented as a series circuit of capacitances C1 and C2.

It should be noted that the inductance L per unit length, the ground capacitance C per unit length, the mutual inductance M and the mutual capacitance Cm, which are included in normal transmission lines as shown in the conventional equivalent circuit diagram of FIG. 22, are omitted from FIG. 3 for the sake of simplicity.

In the prior art, only the first and second capacitances C1 and C2 are considered as circuit components of an additional capacitance element and are believed to contribute to reducing the intensity of the crosstalk by themselves. That is to say, it was believed that the crosstalk could be offset by newly generating a signal, of which the phase is inverse of that of a crosstalk signal that is usually observed on normal transmission lines, for the additional capacitance element.

For example, Japanese Patent Application Laid-Open Publication No. 2004-015534 discloses the results of simulations that were carried out using an equivalent circuit. In the equivalent circuit, the ground capacitance Cg was not considered at all. Actually, however, the effects of suppressing the crosstalk would never be achieved even if the equivalent circuit simulations were carried out without considering the ground capacitance Cg. This is because if there is the ground capacitance Cg, a signal Vdd, of which the phase is no longer inverse of that of the differential signal between Vi and Vc.

Japanese Patent Application Laid-Open Publication No. 2001-257509 does not clearly show whether or not the circuit characteristic was derived by performing circuit simulations but is totally silent about the ground capacitance Cg. Also, in the equivalent circuit of Configuration Example No. 2 of Japanese Patent Application Laid-Open Publication No. 2004-015534 as shown in FIG. 22, an inductance is supposed to be present as a parasitic circuit parameter around the third additional conductor. However, since the inductance is quite different from the ground capacitance Cg, the same effects as those of the present invention cannot be achieved just by inserting the inductance.

Following the principle described above, an additional capacitance element that is specially designed to reduce the ground capacitance Cg is adopted according to the present invention.

In the additional capacitance element of the present invention, the role played by the first and second additional conductors 303 and 305 is no different from the conventional additional capacitance element. This is because the C1 and C2 values that are required on the equivalent circuit are not different from those of the conventional additional capacitance element. That is why the lengths L1 and L2 of the first and second additional conductors 303 and 305 cannot be shorter than those of the conventional pair of transmission lines. Therefore, to reduce the ground capacitance Cg in the additional capacitance element, the area of the portion that is opposed to the ground conductor 105 needs to be reduced by optimizing the configuration of the third additional conductor 307.

The ground capacitance Cg is produced between the ground conductor 105 and the third additional conductor 307. That is why the closer the ground conductor 105 and the third additional conductor 307 are, the less negligible the ground capacitance Cg gets. Conversely, in a configuration in which the distance from the additional capacitance element 301 to the ground conductor 105 is longer than the distance from the first signal strip 102a to the ground conductor 105, the ground capacitance Cg decreases. Thus, compared to such a configuration, the effects of the present invention are achieved more significantly in a configuration in which the first signal strip 102a and the additional capacitance element 301 are arranged on the same circuit plane and in a configuration in which the distance from the additional capacitance element 301 to the ground conductor 105 is shorter than the distance from the first signal strip 102a to the ground conductor 105.

FIGS. 23A and 23B illustrate a transmission line apparatus in which the additional capacitance element 301 is arranged inside the circuit board 101 (i.e., on an inner surface of the circuit). Specifically, FIG. 23A is a perspective view of the transmission line apparatus, while FIG. 23B shows a cross section of the apparatus as viewed on the plane A-B shown in FIG. 23A.

To reduce the size of a circuit, the wiring circuit structure is sometimes formed inside the circuit board 101, not on the surface of the circuit board 101. If the wiring circuit structure is formed inside the circuit board 101, then the additional capacitance element 301 can be formed simultaneously by the process step of forming the wiring circuit structure. That is why the additional capacitance element can be easily arranged on an inner surface of the board as shown in FIGS. 23A and 23B, without introducing any special manufacturing process step.

Generally speaking, in a transmission line apparatus, the effective dielectric constant of the transmission lines is preferably reduced to transmit a signal as quickly as possible. For that purpose, actually it is effective to form the first and second signal strips 102a and 102b on the surface of the circuit board 101. Also, to electrically connect these conductors to a functional element more easily, the first and second signal strips 102a and 102b are preferably arranged on the surface of the circuit board 101. For these reasons, the configuration in which the first and second signal strips 102a and 102b are closer to the ground conductor 105 than the additional capacitance element is (see Japanese Patent Application Laid-Open Publication No. 2004-015534) is not realistic.

In preferred embodiments of the present invention, the additional capacitance element is arranged either on the surface of the circuit board 101 on which the first and second signal strips 102a and 102b are arranged or on an inner surface of the circuit (i.e., inside the circuit board). By adopting such a configuration, the ground capacitance Cg increases, and therefore, the effects of the present invention are achieved more significantly.

It should be noted that not more than one third additional conductor 307 should be arranged. That is to say, just one conductor should be connected to both the first and second additional conductors 303 and 305. If two conductors 315 were connected to the first and second additional conductors 303 and 305 as shown in FIG. 4A, then the effects of the present invention would not be achieved sufficiently. This is because a closed circuit loop formed by the first and second additional conductors 303 and 305 and the conductors 315 might be coupled too strongly to the magnetic field of an RF signal being transmitted through the first or second transmission line.

The conductor with the shape shown in FIG. 4B is not adopted in the present invention, either. In the example illustrated in FIG. 4B, the conductor 315 that connects the first and second additional conductors 303 and 305 has a branch and is connected to the second additional conductor 305 at two points. As a result, a closed circuit loop is also formed by the additional conductors as in the example illustrated in FIG. 4A and the effects of the present invention are achieved sufficiently.

Figure 5A:
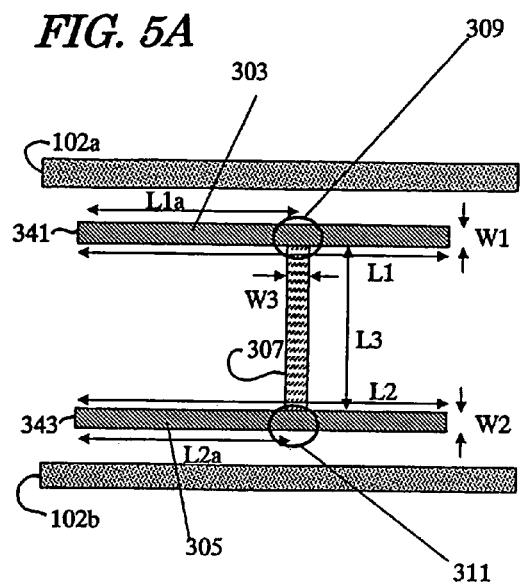
FIGS. 5A and 5B are top views illustrating additional capacitance elements according to a preferred embodiment of the present invention.
Figure 5B:
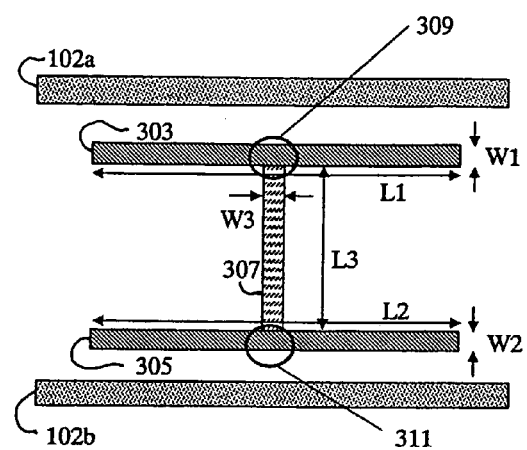

On the other hand, the conductor structure with the shape shown in FIG. 4C may be adopted in the present invention. Specifically, the structure shown in FIG. 4C includes only one third additional conductor 307 that is connected to the first additional conductor 303 at a point and to the second additional conductor 305 at another point, respectively. The other conductor 315 (which will be referred to herein as a "fourth conductor" for convenience sake) is connected to the second additional conductor 305 but is not connected to the first additional conductor 303. That is why no closed circuit loop is formed inside this conductor structure and the function performed by the additional capacitance element of the present invention is not interfered with. However, no positive effects are achieved according to the present invention by introducing conductors other than the third additional conductor 307 (e.g., by adding the conductor 315) into the additional capacitance element of the present invention. Rather, if the conductor 315 is added, the resonant frequency of the additional capacitance element decreases and the operating frequency range of the transmission line apparatus of the present invention narrows. Therefore, an additional capacitance element, in which no conductors other than the third additional conductor 307 are connected to the first and second additional conductors 303 and 305 as shown in FIGS. 5A and 5B, is preferably adopted.

The dimensions of the additional capacitance element of the present invention are determined so as not to produce resonances in the transmission band. In the resonant state, signal components of an RF signal being transmitted through the first or second transmission line and having a frequency corresponding with the resonant frequency might cause unnecessary radiations into the space by way of the additional capacitance element.

The deterioration in crosstalk characteristic, caused between the transmission lines by the additional capacitance element in the resonant state, should also be avoided. In the example illustrated in FIG. 5A, the length as measured from the open end point 341 of the first additional conductor 303 to the open end point 343 of the second additional conductor 305 by way of the connection point between the first and third additional conductors 303 and 307, the third additional conductor 307 and the connection point between the third and second additional conductors 307 and 305, is identified by Lres, which is given by:

$$Lres=L1a+L3+L2a$$

where L1a is the distance from the open end point 341 of the first additional conductor 303 to the connection point 309 between the first and third additional conductors 303 and 307 as measured along the first additional conductor 303 and L2a is the distance from the open end point 343 of the second additional conductor 305 to the connection point 311 between the second and third additional conductors 305 and 307 as measured along the second additional conductor 305.

If the length Lres corresponds to a half of the effective wavelength, then half wave resonances will be produced. For example, supposing the length L3 is sufficiently shorter than the effective wavelength, the sum of L1a and L2a corresponds to the resonator length. The resonator length must be less than a half wavelength. The shape of the additional capacitance element is defined such that the resonance phenomenon never occurs in the transmission frequency range.

The first additional conductor 303 may usually have two open end points but satisfies the following inequality:

$$L1a \geq 0.5 \times L1$$

If the connection point 309 is located at the midpoint of the first additional conductor 303, then L1a=0.5×L1. On the other hand, if the connection point 309 is not located at the midpoint of the first additional conductor 303 as in the example illustrated in FIG. 5A, then L1a is defined with respect to the open end point 341, which is more distant from the connection point 309. The same statement applies to the relationship between the second additional conductor 305 and L2a, which satisfies the following inequality:

$$L2a \geq 0.5 \times L2$$

As is clear from these inequalities, if the connection point 309 is set at the midpoint of the first additional conductor, then the L1a becomes the shortest. In the same way, if the connection point 311 is set at the midpoint of the second additional conductor, then the L1b becomes the shortest. Consequently, if the connection points 309 and 311 are set at the respective midpoints of the first and second additional conductors 303 and 305, the highest resonant frequency is realized.

The third additional conductor 307, which is not considered in the above discussion, makes the resonant frequency highest when connecting the first and second additional conductors 303 and 305 perpendicularly to each other and in the shortest distance. In that case, the additional capacitance element has an H-shaped layout as shown in FIG. 5B.

Figure 6A:
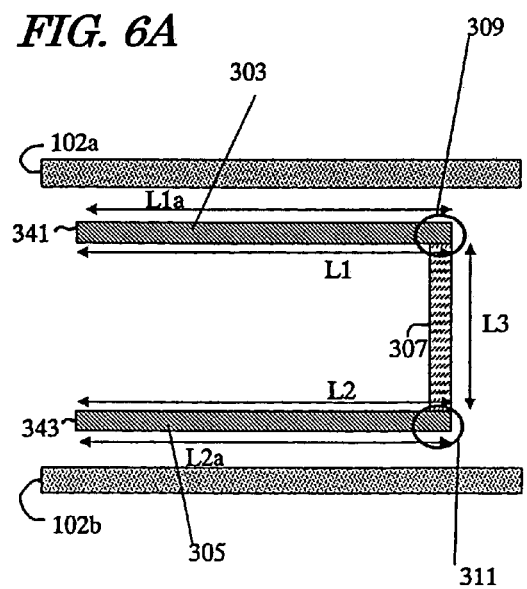
FIGS. 6A and 6B are top views illustrating additional capacitance elements according to another preferred embodiment of the present invention.
Figure 6B:
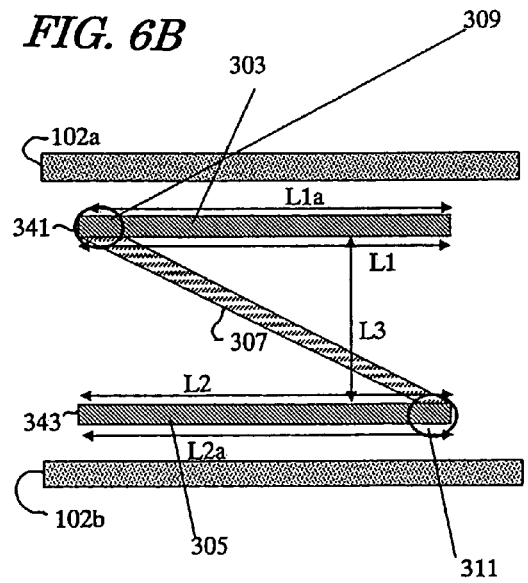

As can be seen from the foregoing description, if the connection points 309 and 311 are set at the open end points of the first and second additional conductors 303 and 305, respectively, then the resonant frequency decreases. For instance, in the example illustrated in FIG. 6A, the additional capacitance element has a U-shaped layout in which L1a=L1 and L2a=L2, thus limiting the operating frequency range. On the other hand, in the example illustrated in FIG. 6B, the resonant frequency further decreases by the electrical length of the third additional conductor 307 compared to the example illustrated in FIG. 6A. That is why this layout is less preferable to that of the additional capacitance element shown in FIG. 5B. Consequently, the best way to increase the resonant frequency and expand the operating frequency range is to adopt the H-shaped layout.

A number of additional capacitance elements may be arranged in the transmission direction. The shapes of those additional capacitance elements that are arranged in the signal transmission direction may be different from each other. However, since the most preferable shape of the additional capacitance elements is the H-shape as shown in FIG. 5B, it is most effective to arrange additional capacitance elements with that H-shape.

The interval between the additional capacitance elements is defined to be less than a quarter of the effective wavelength at the signal frequency in the transmission band. If this condition is satisfied, the crosstalk signal generated per unit length can be reduced effectively.

Also, in a normal configuration in which the first signal strip 102a and all components of the additional capacitance element are arranged on the surface of the substrate, for example, the space between the first signal strip 102a and the first additional conductor 305 may be changed from air into a dielectric.

Figure 7A:
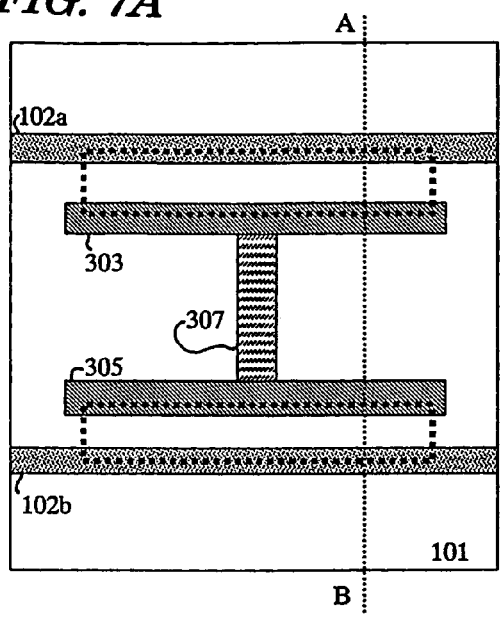
FIGS. 7A and 7B are respectively a partially enlarged top view and a cross-sectional view illustrating another preferred embodiment of the present invention.
Figure 7B:
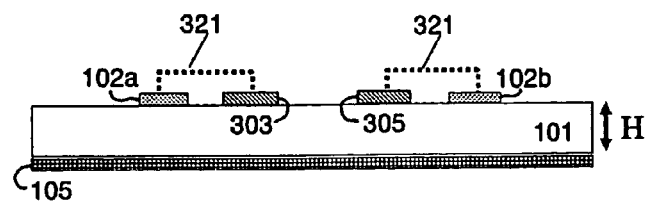

FIG. 7A is a schematic perspective top view illustrating another preferred embodiment of the present invention, and FIG. 7B is a cross-sectional view thereof as viewed on the plane A-B shown in FIG. 7A. As indicated by the dotted lines in FIG. 7A, by replacing the space between the first signal strip 102a and the first additional conductor 303 and the space between second signal strip 102b and the second additional conductor 305, which are usually filled with the air with a dielectric constant of one, by a dielectric 321 of which the dielectric constant is higher than one, C1 and C2 of the additional capacitance element can be increased. See FIG. 7B. In the wiring process of a printed wiring board, a resin such as an epoxy resin may be easily deposited as a resist material over the surface of the board so as not to make portions other than the specified assembling points electrically conductive. Likewise, a resin material such as polyimide is often used during the manufacturing process of a semiconductor device. By using one of these materials as the dielectric 321, C1 and C2 can be easily increased. The height, H of the circuit board 101 is shown in FIG. 7B.

In the preferred embodiments described above, the transmission line apparatus of the present invention is used to transmit a single-ended signal. Alternatively, the present invention is also applicable for use in a system for transmitting a differential signal. According to the present invention, a third signal strip 102c may be arranged near the first signal strip 102a and a differential transmission line 102d may be formed by the first and third signal strips 102a and 102c as shown in FIGS. 8A and 8B. In that case, the additional capacitance element 301 can contribute to reducing the crosstalk between the differential transmission line 102d and the second signal strip 102b (i.e., the other transmission line).

As shown in FIG. 8B, of the two signal strips 102a and 102c that form the differential transmission line 102d, the first signal strip 102a is closer to the second signal strip 102b than the third signal strip 102c is. That is why the additional capacitance element 301 is arranged between the first and second signal strips 102a and 102b. The crosstalk between the two closest transmission lines of the three signal strips 102a, 102b and 102c determines the crosstalk characteristic between the two conductors of the differential transmission line. Consequently, if the additional capacitance element 301 is arranged between the two closest transmission lines, then the crosstalk characteristic can be improved between the differential transmission line 102d and the single-ended transmission line (i.e., the second signal strip 102b).

As in the preferred embodiments of the single-ended signal transmission system, the additional capacitance element 301 also includes a first additional conductor 303, a second additional conductor 305, and a single third additional conductor 307 that is connected to the first additional conductor 303 at a point and to the second additional conductor 305 at another, respectively.

In the example illustrated in FIG. 8B, the differential transmission line 102d is arranged closer to the first additional conductor 303. Alternatively, by arranging the third signal strip 102c near the second signal strip 102b, a differential transmission line 102d consisting of the third and second signal strips 102c and 102b may be arranged closer to the second additional conductor 305. Optionally, first and second differential transmission lines may be formed by four signal strips and the additional capacitance element may be arranged between the first and second differential transmission lines.

FIG. 9A illustrates still another configuration for a transmission line apparatus according to this preferred embodiment. Generally speaking, differential transmission is a transmission method that cannot be effective unless two perfectly symmetrical lines are used. That is to say, if there is any asymmetry between the two lines, the input differential signals will be converted into signals of the same phase, thus causing noise or unwanted radiation. In view of this consideration, in the transmission line apparatus shown in FIG. 9A and 9B, arranged are not just a first additional capacitance element 301 between the first differential transmission line 102d and the second signal strip 102b but also a second additional capacitance element 301a, which is mirror-symmetrical to the first additional capacitance element 301 with respect to the first differential transmission line 102d, thereby minimizing the unwanted conversion into the common mode.

More specifically, the additional capacitance element 301a includes a first additional conductor 303a, which is arranged mirror-symmetrically to the first additional conductor 303 with respect to the first differential transmission line 102d, a second additional conductor 305a, which is arranged mirror-symmetrically to the second additional conductor 305 with respect to the first differential transmission line 102d, and a third additional conductor 307a, which is arranged mirror-symmetrically to the third additional conductor 307 with respect to the first differential transmission line 102d. See FIG. 9B.

Also, even if the second additional capacitance element 301a of FIGS. 9A and 9B is partially removed as shown in FIGS. 10A and 10B, the differential transmission line pair can also reduce the common mode in the transmission line apparatus of the present invention. In the additional capacitance element 301a, the first additional conductor 303a is closer to the first differential transmission line 102d than anything else. That is why the additional capacitance element 301a that should be arranged mirror-symmetrically to the additional capacitance element 301 with respect to the first differential transmission line 102d should include at least a member that is arranged mirror-symmetrically to the first additional conductor 303 with respect to the first differential transmission line 102d. The advantage of the additional capacitance element 301 of the present invention over the conventional one is that the third additional conductor 307 can reduce the ground capacitance as described above. And this advantage can be enjoyed in this case, too. That is to say, in the transmission line apparatus of the present invention, the ground capacitance has been reduced by the third additional conductor 307 in advance, and therefore, the characteristic of the additional capacitance element 301 that faces the first signal strip 102a does not reflect the characteristic of the third additional conductor 307 easily. That is why even if the structure that is mirror-symmetrical to the third additional conductor 307 is removed from the additional capacitance elements 301 and 301a, the common mode is still less likely to manifest itself than in the conventional additional capacitance element.

In the preferred embodiments described above, the crosstalk between the differential transmission line and the single-ended transmission line is suppressed. According to the present invention, however, the crosstalk between two differential transmission lines can also be suppressed.

EXAMPLES

Transmission wiring circuit structures were made as samples representing specific examples of the present invention and Prior Art Examples by using a dielectric substrate with a dielectric constant of three and a total thickness of 150 µm as a circuit board. The entire back surface of the substrate was turned into a conductor by covering the back surface with copper wiring with a thickness of 40 µm. In this manner, a ground conductor was formed on the back surface. The principal surface of the substrate was also turned into a conductor with copper wiring with a thickness of 40 µm and then the conductor was partially removed by a wet etching process, thereby forming a pattern there.

To achieve a characteristic impedance of 50 Ω, two microstrip lines, in which the signal strips had a line width of 350 µm, were arranged parallel to each other as first and second transmission lines of a single-ended signal transmission system. And the crosstalk characteristic between the two transmission lines was measured in a frequency range up to 30 GHz.

The coupled line length Lcp was 1 cm. The characteristic was evaluated by a four-terminal RF technique. Specific examples of the present invention and comparative examples were made with or without the additional capacitance elements provided and with the parameters of the additional capacitance elements changed. And their characteristics were compared with each other. The gap G between the lines was 700 μm, which was twice as large as the line width. In Prior Art Example No. 1, no additional capacitance elements were arranged at all.

On the other hand, Prior Art Example No. 2 was made by inserting a rectangular additional capacitance element with the shape shown in FIG. 2C between the two lines. The gap between the edge of each line and the additional capacitance element was 80 μm. The additional capacitance element had an overall conductor width of 580 μm (which was the width from the top of the first additional conductor through the bottom of the second additional conductor) and a conductor length L1=L2 of 1.9 mm as measured in the signal transmission direction. Five additional capacitance elements were arranged in the length direction at a pitch of 2 mm. The gap between the additional capacitance elements was 100 μm.

FIG. 11 shows the frequency dependence of the crosstalk characteristic in Prior Art Example No. 1. It was confirmed that as the frequency increased, the crosstalk characteristic deteriorated monotonically. In Prior Art Example No. 2, on the other hand, even though the additional capacitance element was newly introduced into the structure of Prior Art Example No. 1, the crosstalk characteristic could hardly be improved after all. For example, at 10 GHz, the crosstalk intensity was −22.7 dB in Prior Art Example No. 1 but −22.4 dB in Prior Art Example No. 2. That is to say, the characteristic deteriorated by 0.3 dB. In the entire frequency range under measurement, the difference in characteristic between Prior Art Examples Nos. 1 and 2 was within ±0.5 dB.

On the other hand, FIG. 12 shows the change in the decrease of the crosswalk intensity in decibels (db) as a function of frequency (GHz) in Example No. 1 as compared to Prior Art Example No. 1. Example No. 1 is a transmission line apparatus obtained by replacing the additional capacitance element of Prior Art Example No. 2 with the H-shaped capacitance element as shown in FIG. 5B. The third additional conductor 307 connected together the respective midpoints of the first and second additional conductors 303 and 305. The third additional conductor had a line width W3 of 80 μm, so were the line widths W1 and W2 of the first and second additional conductors. Example No. 1 exhibited better isolation characteristic than Prior Art Example No. 1 over the entire frequency range under measurement, thus proving the beneficial effects of the present invention. For example, at 10 GHz, Example No. 1 had a crosstalk intensity of −29.4 dB, which was an improvement of as much as 6.7 dB over Prior Art Example No. 1. Measurements were further carried out in an even higher frequency range. As a result, it was confirmed that the additional capacitance element adopted in this example had a resonant frequency of 37.5 GHz.

Next, Examples Nos. 1A, 1B and 1C were made by changing the W3 value of the additional capacitance element of Example No. 1 into 500 μm, 1,000 μm and 1,500 μm, respectively. The magnitudes of the crosstalk intensities that could be reduced at 10 GHz by Examples Nos. 1, 1A, 1B and 1C from that of Prior Art Example No. 1 are summarized in the following Table 1:

TABLE 1

|  | W3 | Crosstalk could be reduced by |
|---|---|---|
| Example 1 | 80 μm | 6.7 dB |
| Example 1A | 500 μm | 3.1 dB |
| Example 1B | 1,000 μm | 1.4 dB |
| Example 1C | 1,500 μm | 0.7 dB |

The crosstalk characteristic intensities at 10 GHz were −25.8 dB, −24.1 dB and −23.4 dB in Examples No. 1A, 1B and 1C, respectively. Thus, it was clear that the crosstalk characteristic could be improved by reducing Cg.

Next, Examples Nos. 2A and 2B were made by changing the shape of the additional capacitance element of Example No. 1. In both of these two examples, the additional capacitance element had a conductor width of 80 μm. Specifically, the additional capacitance element had an N-shaped layout in Example No. 2A and a U-shaped layout in Example No. 2B, respectively (see FIG. 6A). The magnitudes of the crosstalk intensities that could be reduced at 10 GHz by Examples Nos. 1, 2A and 2B from that of Prior Art Example No. 1 and the resonant frequencies thereof are summarized in the following Table 2:

TABLE 2

|  | Layout | Crosstalk could be reduce by | Resonant frequency |
|---|---|---|---|
| Example 1 | H-shaped | 6.7 dB | 37.5 GHz |
| Example 2A | N-shaped | 6.5 dB | 20.1 GHz |
| Example 2B | U-shaped | 6.8 dB | 21.2 GHz |

Both of Examples Nos. 2A and 2B, in which the third additional conductor reduced the ground capacitance, could suppress the crosstalk well, thus achieving the effects of the present invention. Also, comparing the resonant frequencies, it can be seen that the H-shaped additional capacitance element has the most effective structure.

Next, using the same circuit board as that adopted in Prior Art Example No. 1 and Example No. 1, Prior Art Example No. 3 and Example No. 3, each including two differential transmission line pairs, were made and the crosstalk characteristic between the differential transmission line pairs was measured. The coupled line length Lcp was 1 cm. Each differential transmission line pair was parallel coupled lines with a line width of 200 μm and a line-to-line gap of 120 μm. The gap between the two differential transmission line pairs was 400 μm, which was twice as large as the line width of the signal strips. Prior Art Example No. 3 was a circuit that included no additional capacitance elements at all. Additional capacitance elements having the same H-shaped layout as Example No. 1 were arranged between the two differential transmission line pairs of Prior Art Example No. 3. Example No. 1 had a gap of 700 μm between the two transmission lines, whereas Example No. 3 had a decreased gap of 400 μm between the two transmission line pairs. That is why compared to the additional capacitance elements of Example No. 1, the additional capacitance elements of Example No. 3 included first and second additional conductors that were arranged with their gap narrowed by 300 μm. As in Example No. 1, five additional capacitance elements were also arranged at a pitch of 2 mm in this Example No. 3.

Figure 13B:
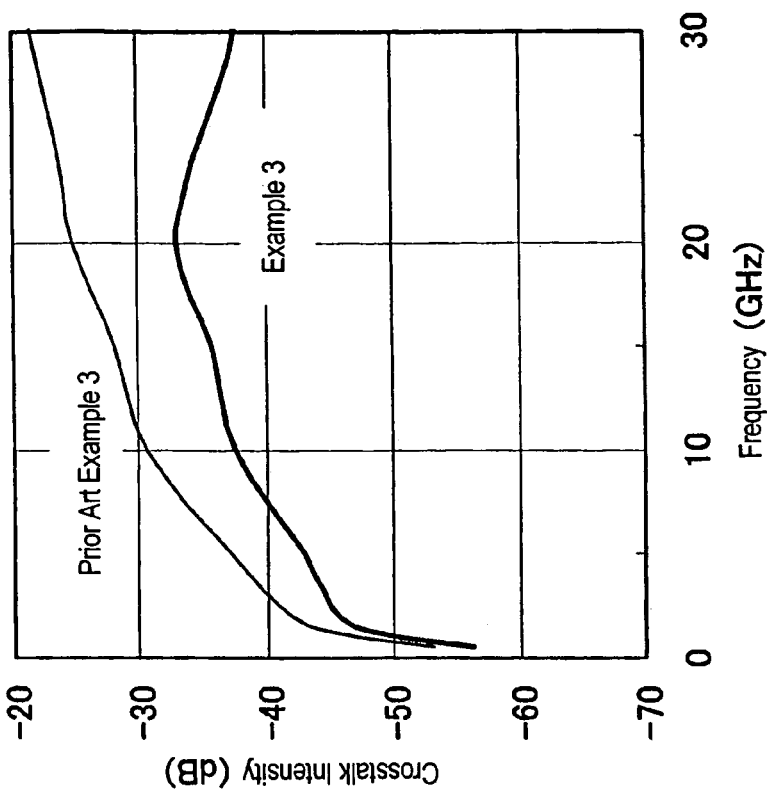
FIG. 13B shows the frequency dependences of the intensities of a common signal that was output through far-end crosstalk terminals in response to a differential signal that had been input to differential input terminals for Prior Art Example No. 3 and Example No. 3.
Figure 13A:
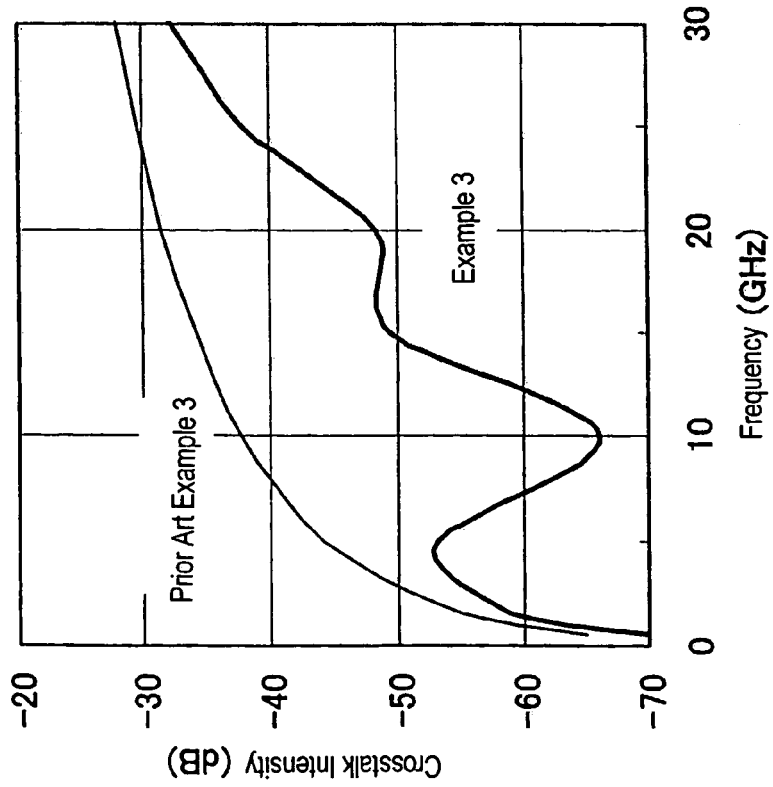
FIG. 13A shows the frequency dependences of the intensities of a differential signal that was output through far-end crosstalk terminals in response to a differential signal that had been input to differential input terminals for Prior Art Example No. 3 and Example No. 3.

FIGS. 13A and 13B show the characteristics of Example No. 3 and Prior Art Example No. 3 in comparison. Unlike in a single-ended transmission system, two far-end crosstalk characteristics should be improved in such a differential transmission line pair. Specifically, FIG. 13A shows the intensities of a differential crosstalk signal that was output through far-end crosstalk differential terminals in response to a differential signal that had been input to differential input terminals. On the other hand, FIG. 13B shows the intensities of a common crosstalk signal that was output through far-end crosstalk differential terminals in response to a differential signal that had been input to differential input terminals. In either case, Example No. 3 could improve the crosstalk characteristic better than Prior Art Example No. 3. At 10 GHz, for example, the intensity of the differential crosstalk signal could be improved from −37.7 dB to −66.2 dB, and the intensity of the common crosstalk signal could be improved from −30.6 dB into −37.7 dB. Prior Art Example No. 4, in which the additional capacitance elements of Example No. 3 were replaced with rectangular ones, exhibited a similar characteristic to Prior Art Example No. 3.

Figure 14:
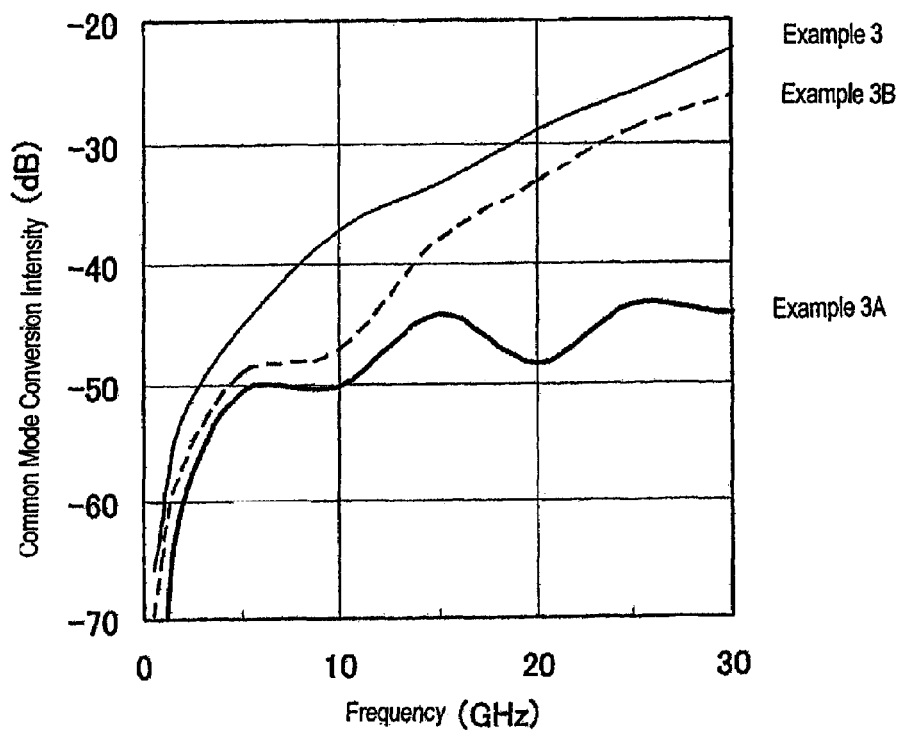
FIG. 14 shows the frequency dependences of the intensities of common signals that were output through transmission terminals in response to a differential signal that has been input to the differential terminals for Examples Nos. 3, 3A and 3B.
Figure 15A:
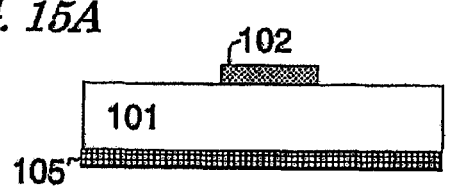
FIGS. 15A and 15B illustrate cross-sectional structures of conventional transmission lines to carry out single-ended transmission and to transmit a differential signal, respectively.
Figure 15B:
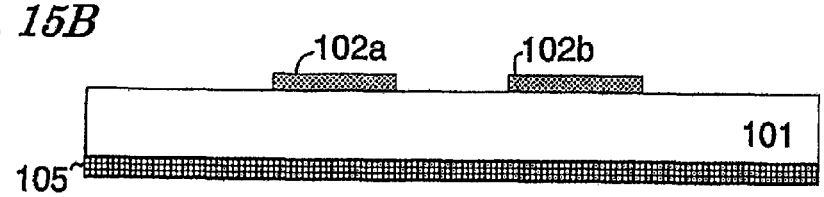
Figure 16A:
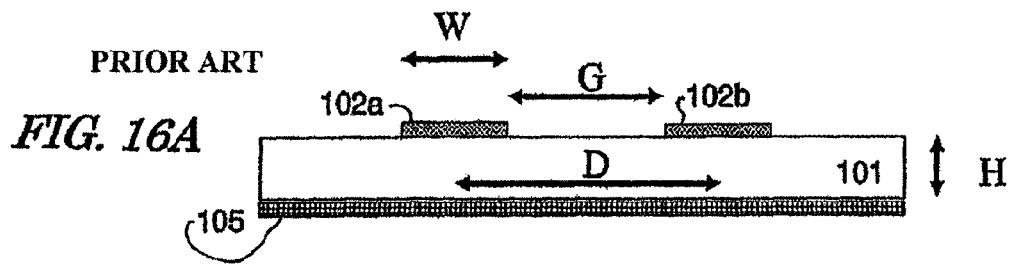
FIGS. 16A and 16B are respectively a cross-sectional view and a top view illustrating a circuit including a number of signal strips that are arranged parallel to each other.
Figure 16B:
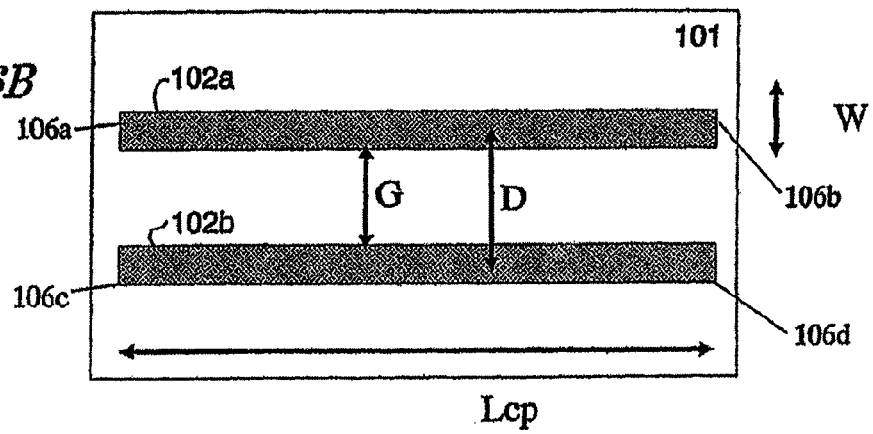
Figure 17:
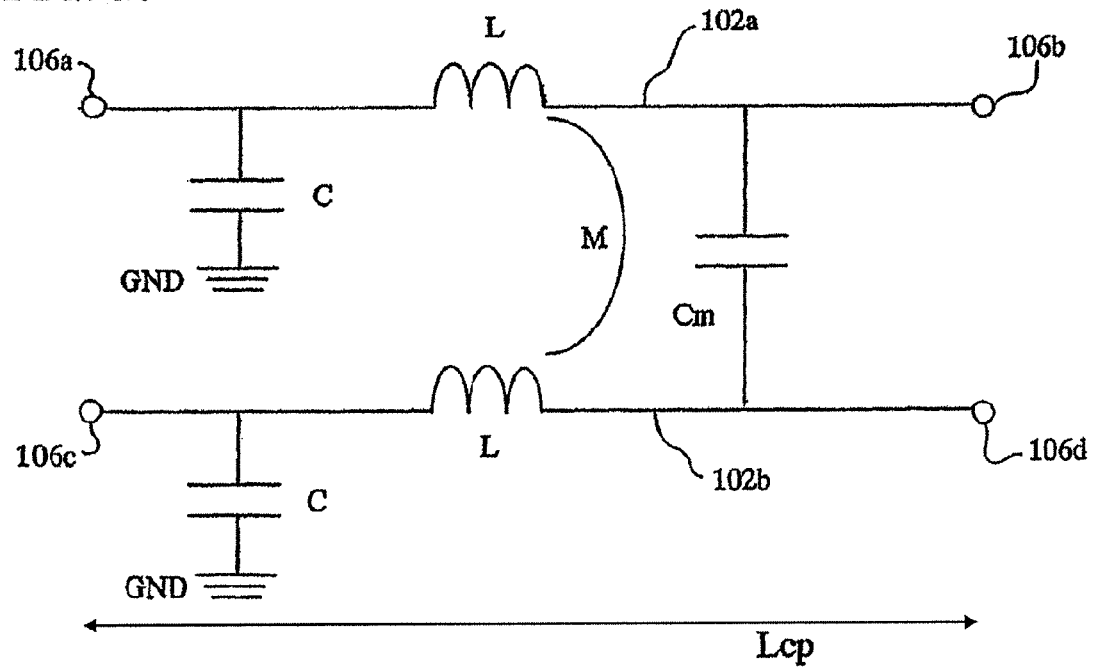
FIG. 17 is an equivalent circuit diagram of a transmission line pair.

Next, Example No. 3A was made by arranging the group of additional capacitance elements, which were located only between the two differential transmission line pairs in Example No. 3, mirror-symmetrically to the two differential transmission line pairs (i.e., on the right- and left-hand sides of each differential transmission line pair). Example No. 3B was also made by arranging only the additional capacitance element, which was located only between the two differential transmission line pairs in Example No. 3 and closest to the two differential transmission line pairs, mirror-symmetrically to the two differential transmission line pairs (i.e., on the right- and left-hand sides of each differential transmission line pair). The resultant crosstalk characteristics of Examples Nos. 3A and 3B were similar to that of Example No. 3 shown in FIG. 13. On the other hand, FIG. 14 shows the intensities of common signals (i.e., common mode conversion intensities) that were output through transmission terminals in response to a differential signal that has been input to the differential terminals. Example No. 3A including a circuit with the highest degree of layout symmetry exhibited the lowest common mode conversion intensity. Example No. 3B, of which the degree of circuit layout symmetry was not so high as Example 3A but still higher than Example No. 3, could achieve the effect of reducing the common mode conversion. It should be noted that the common mode conversion intensity of Prior Art Example No. 1 was comparable to that of Example No. 3A.

A transmission line apparatus according to the present invention can reduce the intensity of crosstalk between two lines and can transmit a signal at a low loss. Consequently, an RF circuit including the transmission line apparatus of the present invention can have its circuit area reduced by arranging the lines densely and can operate much faster and saves power, which has been difficult to realize in the prior art due to leakage of signals. Also, the present invention is extensively applicable for use not just in data transmission but also in filters, antennas, phase shifters, switches, oscillators and other telecommunications devices. The present invention can also find applications in various fields that use radio transmission techniques such as power transmission and ID tags.

While the present invention has been described with respect to preferred embodiments thereof, it will be apparent to those skilled in the art that the disclosed invention may be modified in numerous ways and may assume many embodiments other than those specifically described above. Accordingly, it is intended by the appended claims to cover all modifications of the invention that fall within the true spirit and scope of the invention.

What is claimed is:

1. A transmission line apparatus comprising: a substrate with a ground conductor plane; and a first signal strip and a second signal strip, which are supported on the substrate and arranged in parallel with each other,
   wherein the apparatus further includes at least one additional capacitance element that connects the first and second signal strips together, and
   wherein the at least one additional capacitance element includes:
   a first additional conductor that is arranged with a space left with respect to the first signal strip;
   a second additional conductor that is arranged with a space left with respect to the second signal strip; and
   a third additional conductor that is connected to the first additional conductor at a point and to the second additional conductor at another point, respectively, and
   wherein when measured in a signal transmission direction, a smallest width W3a of the third additional conductor is shorter than a length L1 of the first additional conductor or a length L2 of the second additional conductor, and
   wherein the at least one additional capacitance element has a resonant frequency that is higher than the frequency of a signal being transmitted.

2. The apparatus of claim 1, wherein the first signal strip, the second signal strip and the at least one additional capacitance element are all positioned on a same surface of said substrate.

3. The apparatus of claim 1, wherein the first and second signal strips are arranged on the surface of the substrate, and
   wherein the additional capacitance element is located between the surface of the substrate and the ground conductor plane.

4. The apparatus of claim 3, wherein the at least one additional capacitance element is located closer to the ground conductor plane than to the surface of the substrate.

5. The apparatus of claim 1, wherein the lengths L1 and L2 of the first and second additional conductors are equal to each other, and
   wherein the respective midpoints of the first and second additional conductors are connected together by the third additional conductor, and
   wherein the third additional conductor crosses the first additional conductor at right angles.

6. The apparatus of claim 1, wherein the at least one additional capacitance element includes a plurality of additional capacitance elements that are arranged in the direction of said signal transmission.

7. The apparatus of claim 6, wherein the interval between the plurality of additional capacitance elements is one quarter or less of an effective wavelength corresponding to the frequency of the signal being transmitted.

8. The apparatus of claim 1, wherein the first and second signal strips and the first and second additional conductors are arranged on the surface of the substrate, and
   wherein the space between the first signal strip and the first additional conductor and the space between the second signal strip and the second additional conductor are filled at least partially with a dielectric material that has a higher dielectric constant than air.

9. The apparatus of claim 1, further comprising a third signal strip, which is arranged with a space left with respect to the first signal strip,
   wherein the first and third signal strips provide a differential transmission line.

10. The apparatus of claim 9, wherein a fourth additional conductor, having a structure which is symmetric to that of the first additional conductor with respect to a central symmetric plane of the differential transmission line, is arranged with a space left with respect to the third signal strip.

11. The apparatus of claim 1, further comprising a third signal strip, which is arranged with a space left with respect to the second signal strip, wherein the second and third signal strips provide a differential transmission line.

12. The apparatus of claim 11, wherein a fourth additional conductor, having a structure which is symmetric to that of the second additional conductor with respect to a central symmetric plane of the differential transmission line, is arranged with a space left with respect to the third signal strip.

* * * * *